United States Patent
Choi et al.

(10) Patent No.: US 12,299,230 B2
(45) Date of Patent: May 13, 2025

(54) DISPLAY DEVICE

(71) Applicant: Samsung Display Co., Ltd., Yongin-si (KR)

(72) Inventors: Wonjun Choi, Yongin-si (KR); Kicheol Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/487,829

(22) Filed: Oct. 16, 2023

(65) Prior Publication Data

US 2024/0241596 A1    Jul. 18, 2024

(30) Foreign Application Priority Data

Jan. 17, 2023    (KR) .................. 10-2023-0006606

(51) Int. Cl.
*G06F 3/041* (2006.01)
*G06F 3/044* (2006.01)
*H10K 59/40* (2023.01)

(52) U.S. Cl.
CPC ........ *G06F 3/04164* (2019.05); *G06F 3/0412* (2013.01); *G06F 3/0444* (2019.05); *G06F 3/0446* (2019.05); *G06F 3/0448* (2019.05); *H10K 59/40* (2023.02); *G06F 3/0418* (2013.01); *G06F 2203/04107* (2013.01); *G06F 2203/04111* (2013.01)

(58) Field of Classification Search
CPC .. G06F 3/04164; G06F 3/0412; G06F 3/0444; G06F 3/0446; G06F 3/0448; G06F 3/0418; G06F 2203/04107; G06F 2203/04111; G06F 2203/04112; G06F 3/046; H10K 59/40
See application file for complete search history.

(56) References Cited

U.S. PATENT DOCUMENTS

| | | | |
|---|---|---|---|
| 11,385,751 B2 | 7/2022 | Bang et al. | |
| 2018/0039358 A1 | 2/2018 | Xie et al. | |
| 2018/0039364 A1* | 2/2018 | Pan | H01L 24/16 |
| 2018/0113548 A1* | 4/2018 | Lee | G06F 3/0445 |
| 2019/0237533 A1* | 8/2019 | Kim | H01L 27/0292 |
| 2019/0310731 A1 | 10/2019 | Rhe et al. | |
| 2019/0361551 A1* | 11/2019 | Lius | G06F 3/0412 |
| 2021/0193754 A1* | 6/2021 | Han | H10K 59/122 |
| 2021/0233474 A1* | 7/2021 | Lee | H10K 59/131 |
| 2021/0257577 A1* | 8/2021 | Bang | H10K 50/841 |
| 2021/0399262 A1* | 12/2021 | Woo | H10K 59/873 |
| 2022/0004282 A1 | 1/2022 | Lee et al. | |
| 2024/0045540 A1* | 2/2024 | Rhe | G06F 3/0443 |
| 2024/0045551 A1* | 2/2024 | Kim | H10K 59/122 |

FOREIGN PATENT DOCUMENTS

KR    10-2021-0056468 A    5/2021

* cited by examiner

*Primary Examiner* — Jose R Soto Lopez

(74) *Attorney, Agent, or Firm* — Womble Bond Dickinson (US) LLP

(57) ABSTRACT

Disclosed is a display device including an input sensor. The input sensor includes a first group electrode and a second group electrode that overlap a sensing region. The first group line is connected to the first group line, and overlaps the sensing region. The first group line is substantially uniformly located in a first region of the sensing region, and is located more densely in a second region of the sensing region than in the first region. A length of the first group line located in the second region is less than that of the first group line located in the first region.

20 Claims, 19 Drawing Sheets

DISPLAY DEVICE

CROSS-REFERENCE TO RELATED APPLICATION

This application claims priority to, and the benefit of, Korean Patent Application No. 10-2023-0006606 filed on Jan. 17, 2023, in the Korean Intellectual Property Office, the disclosure of which is hereby incorporated by reference in its entirety.

BACKGROUND

1. Field

The present disclosure relates to a display device including an input sensor.

2. Description of the Related Art

There have been developed a variety of display devices used for multimedia apparatuses, such as televisions, mobile phones, tablet computers, navigation systems, and game consoles. A keyboard or a mouse may be included as an input device for the display device. In addition, the display device may be provided with an input sensor as the input device.

SUMMARY

The present disclosure provides a display device including an input sensor with a relatively high degree of design freedom of sensing electrodes and trace lines.

According to one or more embodiments of the present disclosure, a display device may include an input sensor including a first input sensor that overlaps a first sensing region, and that includes an insulation layer, a first group electrode extending in a first direction, and including a first electrode to an nth electrode that are arranged in a second direction crossing the first direction, a second group electrode crossing the first group electrode, and including a first electrode to an mth electrode, a first group line including a first trace line to an nth trace line that are respectively electrically connected to the first electrode to the nth electrode of the first group electrode, and a second group line including a first trace line to an mth trace line that are respectively electrically connected to the first electrode to the mth electrode of the second group electrode, and a second input sensor that overlaps a second sensing region that is different from the first sensing region, wherein n and m are natural numbers equal to or greater than 2, n being greater than m and not being an integer multiple of the m, wherein the first trace line to the $n^{th}$ trace line of the first group line overlap the first sensing region, wherein the first trace line to an $i^{th}$ trace line among the first to $n^{th}$ trace lines of the first group line are uniformly located to correspond to the first electrode to an $(m-1)^{th}$ electrode of the second group electrode, i being a natural number equal to or greater than 2, wherein an $(i+1)^{th}$ trace line to the $n^{th}$ trace line among the first to $n^{th}$ trace lines of the first group line are located to correspond to the $m^{th}$ electrode of the second group electrode, and wherein a number of the $(i+1)^{th}$ to the $n^{th}$ trace lines is greater than a number of trace lines of the first group line that correspond to the (m−1)th electrode of the second group electrode.

Respective lengths of the $(i+1)^{th}$ to the $n^{th}$ trace lines may decrease from the $(i+1)^{th}$ trace line toward the $n^{th}$ trace line.

Respective resistances of the $(i+1)^{th}$ to the $n^{th}$ trace lines may decrease from the $(i+1)^{th}$ trace line toward the $n^{th}$ trace line.

One trace line among the $(i+1)^{th}$ to the $n^{th}$ trace lines may include a first extension line segment, wherein another trace line among the $(i+1)^{th}$ to the $n^{th}$ trace lines adjacent to the one trace line includes a 1-$1^{st}$ extension line segment on a same line as, and spaced apart in the second direction from, the first extension line segment, and is closer to the $n^{th}$ trace line than the one trace line.

The one trace line may further include a second extension line segment spaced apart in the first direction from the first extension line segment and the 1-$1^{st}$ extension line segment.

The one trace line may further include a third extension line segment that is spaced apart in the first direction from the second extension line segment, and is farther away from the $n^{th}$ trace line than the second extension line segment.

In the first sensing region, the first trace line to the $n^{th}$ trace line of the first group line may respectively overlap corresponding ones of the first to the $n^{th}$ electrodes of the first group electrode, and do not overlap any of the first to $m^{th}$ electrodes of the second group electrode.

A number of the corresponding ones of the first to the $n^{th}$ electrodes of the first group electrode may decrease from the first trace line to the $n^{th}$ trace line of the first group line.

Respective lengths of the first trace line to the $n^{th}$ trace line may decrease from the first trace line toward the $n^{th}$ trace line of the first group line.

The second group electrode and the first group line may extend in substantially a same direction in the first sensing region.

Each of the first electrode to the $m^{th}$ electrode of the second group electrode may include division electrodes extending substantially in the second direction and being spaced apart from each other in the first direction in the first sensing region, wherein the first group line corresponding to the first electrode to the $m^{th}$ electrode of the second group electrode is between the division electrodes in the first sensing region.

The division electrodes may have a unitary shape in the first sensing region, and are on the insulation layer.

Each of the first electrode to an $i^{th}$ electrode of the first group electrode may include sensing patterns on the insulation layer, and arranged in the first direction, and bridge patterns below the insulation layer, and respectively connecting neighboring ones of the sensing patterns through contact holes that penetrate the insulation layer.

The first group line and the second group line may be below the insulation layer in the first sensing region, wherein the first input sensor further includes a dummy electrode at a same layer of the first group line and the second group line, the dummy electrode overlapping the first electrode group and the second electrode group.

The display device may further include a display panel including emission regions and a non-emission region between the emission regions below the first input sensor and the second input sensor, wherein the first group line, the second group line, and the dummy electrode overlap the non-emission region.

Each of the division electrodes may define openings that correspond to the emission regions.

The emission regions may include a first color emission region, a second color emission region, and a third color emission region collectively defining a unit emission region that includes a first unit emission region at which the first color emission region and the second color emission region are on one side of the third color emission region, and at which the third color emission region is on a downside position in the second direction with respect to the first color emission region and the second color emission region, and a second unit emission region at which the first color emission region and the second color emission region are on one side of the third color emission region, and at which the third color emission region is on an upside position in the second direction with respect to the first color emission region and the second color emission region, wherein the first unit emission region and the second unit emission region are alternately located along the first direction, and are alternately located along the second direction, and wherein the openings include a first opening that corresponds to the first color emission region, a second opening that corresponds to the second color emission region, and a third opening that corresponds in common to the third color emission region of the first unit emission region and the third color emission region of the second unit emission region, the third color emission region of the first unit emission region and the third color emission region of the second unit emission region being adjacent to each other in the second direction.

Each of the division electrodes may include a first line segment that extends in the first direction, and a second line segment that extends in the second direction, wherein the dummy electrode includes a first line segment that extends in the first direction, and that overlaps the first line segment of a corresponding one of the division electrodes, and a second line segment that extends in the second direction, and that overlaps the second line segment of the corresponding division electrode, and wherein a width of the first line segment of the dummy electrode is less than a width of the first line segment of the corresponding division electrode.

The insulation layer may overlap the first sensing region and the second sensing region, wherein the second input sensor has a configuration substantially similar to a configuration of the first input sensor, and wherein an arrangement of the first group line in the second input sensor is laterally symmetric to an arrangement of the first group line in the first input sensor.

According to one or more embodiments of the present disclosure, a display device may include an input sensor including a sensing region, a non-sensing region adjacent to the sensing region, a first group electrode extending in a first direction in the sensing region, and including a first electrode to an $n^{th}$ electrode that are arranged in a second direction crossing the first direction, a second group electrode crossing the first group electrode, and including a first electrode to an $m^{th}$ electrode in the sensing region, a first group line including a first trace line to an $n^{th}$ trace line that are respectively electrically connected to the first electrode to the $n^{th}$ electrode of the first group electrode, and a second group line including a first trace line to an $m^{th}$ trace line that are respectively electrically connected to the first electrode to the $m^{th}$ electrode of the second group electrode, wherein the first trace line to the $n^{th}$ trace line of the first group line overlap the sensing region, wherein the first trace line to the $m^{th}$ trace line of the second group line overlap the non-sensing region, wherein the sensing region includes sensing units arranged in an n×m arrangement, wherein the sensing units have a crossing area where one of the first to $n^{th}$ electrodes of the first group electrode crosses one of the first to $m^{th}$ electrodes of the second group electrode, wherein k lines of the first group line are on every corresponding sensing unit in a first region of the sensing unit, k being a natural number equal to or greater than 1, wherein p lines of the first group line are on every corresponding sensing unit in a second region of the sensing unit, p being a natural number greater than k, and wherein the first group line in the second region has a length that is less than a length of the first group line in the first region.

DETAILED DESCRIPTION

Figure 1:
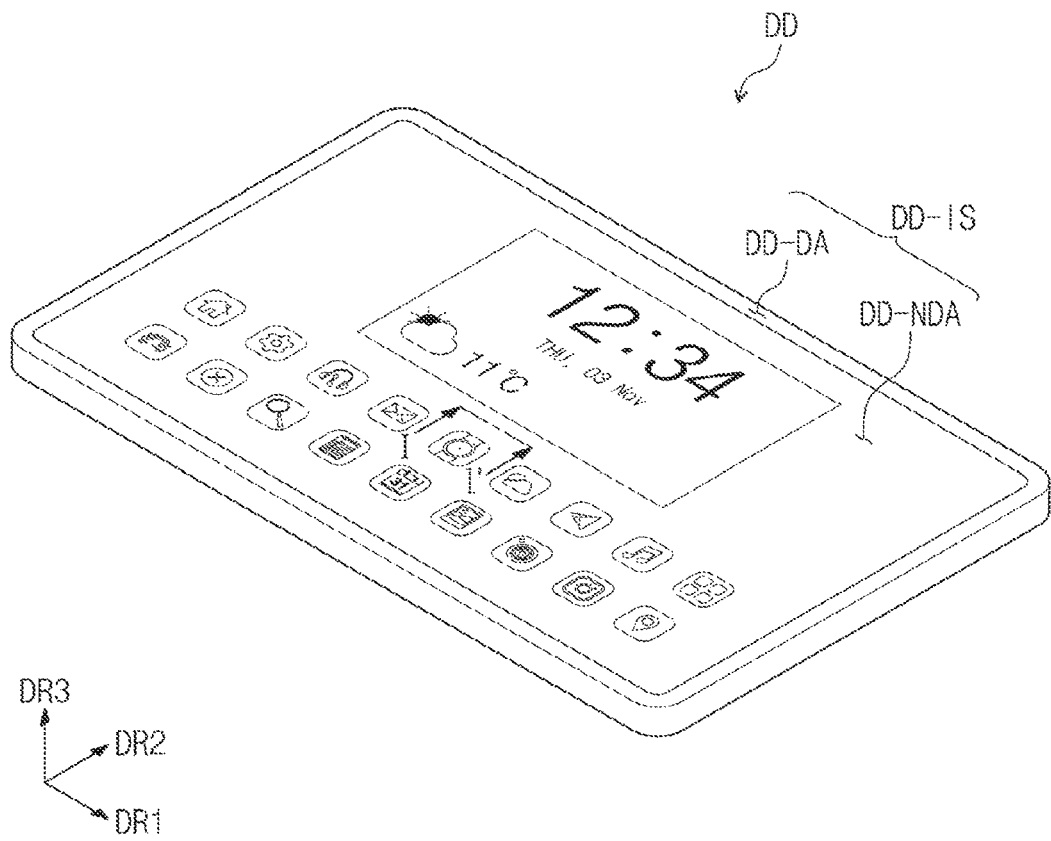
FIG. 1 illustrates a perspective view showing a display device according to one or more embodiments of the present disclosure.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The present disclosure covers all modifications, equivalents, and replacements within the idea and technical scope of the present disclosure. Further, each of the features of the various embodiments of the present disclosure may be combined or combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 illustrates a perspective view showing a display device DD according to one or more embodiments of the present disclosure. As shown in FIG. 1, the display device DD may display an image on a display surface DD-IS. The display surface DD-IS may be parallel to a plane defined by a first directional axis DR1 and a second directional axis DR2. A third directional axis DR3 may indicate a normal direction of the display surface DD-IS, or a thickness direction of the display device DD.

The third directional axis DR3 differentiates top and rear surfaces (or top and bottom surfaces) of each member or unit which will be discussed below. However, the first, second, and third directional axes DR1, DR2, and DR3 are illustrated by way of example. In the following description, first, second, and third directions are directions indicated by the first, second, and third directional axes DR1, DR2, and DR3 and are allocated the same reference symbols.

In one or more embodiments of the present disclosure, the display device DD is illustrated to have a flat display surface, but the present disclosure is not limited thereto. The display device DD may include a curved display surface or a cubic display surface. The cubic display surface may include a plurality of display regions, such as a bended display surface, that denote different directions from each other. A flexible display device may be adopted as the display device DD. The flexible display device DD may be a foldable display device capable of being folded.

Depicted by way of example is the display device DD that can be applicable to a tablet terminal. The tablet terminal may be configured to include the display device DD in a bracket/casing, which accommodates a main-board on which are installed electronic modules, a camera module, a power module, and the like. The display device DD according to the present disclosure may be applicable not only to large-sized electronic devices, such as television sets and monitors, but also may be applicable to small and middle-sized electronic devices, such as mobile phones, automotive navigation systems, game consoles, and smart watches.

As shown in FIG. 1, the display surface DD-IS may include an image region DD-DA that displays the image and a bezel region DD-NDA adjacent to the image region DD-DA. The bezel region DD-NDA may be a zone on which no image is displayed. FIG. 1 depicts icon images as an example of the image.

The image region DD-DA may have a substantially tetragonal shape as illustrated in FIG. 1. The expression "a substantially tetragonal shape" may include not only a tetragonal shape in the mathematical sense, but a tetragonal shape whose edge (or corner) is defined without a vertex, but with a curved boundary.

The bezel region DD-NDA may surround the image region DD-DA. The present disclosure, however, is not limited thereto, and the bezel region DD-NDA may be changed in shape. For example, the bezel region DD-NDA may be located only on one side of the image region DD-DA.

Figure 2:
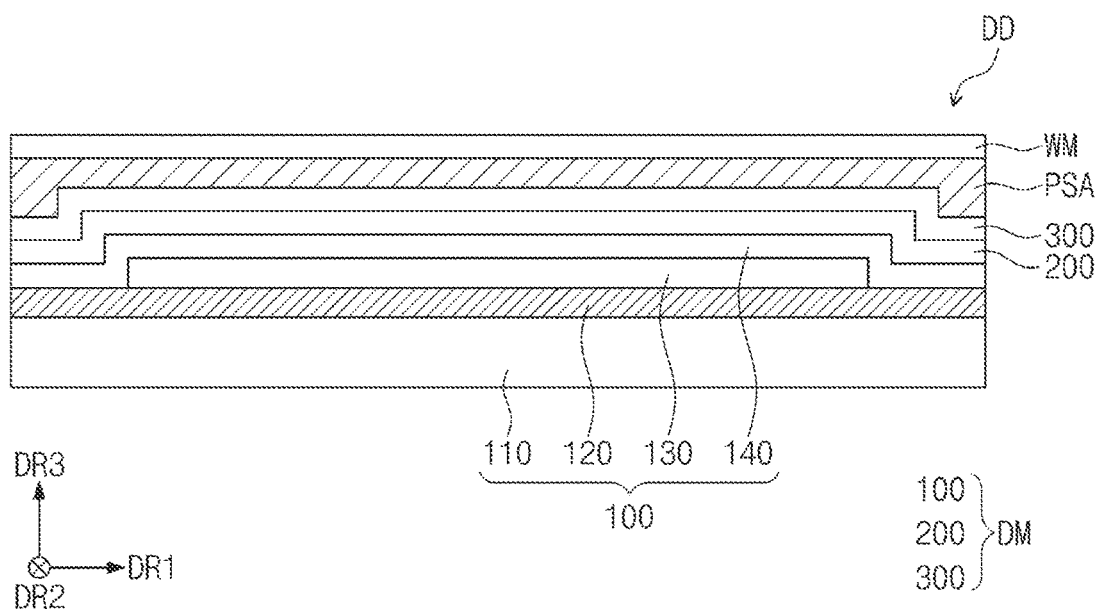
FIG. 2 illustrates a cross-sectional view showing a display device according to one or more embodiments of the present disclosure.

FIG. 2 illustrates a cross-sectional view showing the display device DD according to one or more embodiments of the present disclosure.

The display device DD may include a display module DM and a window WM located on the display module DM. The display module DM and the window WM may be combined with each other through an adhesion layer PSA.

The display module DM may include a display panel 100, an input sensor 200, and an antireflection layer 300. The display panel 100 may include a base layer 110, a driving element layer 120, a light-emitting element layer 130, and an encapsulation layer 140.

The driving element layer 120 may be located on a top surface of the base layer 110. The base layer 110 may be a flexible substrate that can be bendable, foldable, or rollable. The base layer 110 may be a glass substrate, a metal substrate, or a polymer substrate. The present disclosure, however, is not limited thereto, and the base layer 110 may be an inorganic layer, an organic layer, or a composite material layer. Substantially, the base layer 110 may have the same shape as that of the display panel 100.

The base layer 110 may have a multi-layered structure. For example, the base layer 110 may include a first synthetic resin layer, a second synthetic resin layer, and inorganic layers located between the first and second synthetic resin layers. Each of the first and second synthetic resin layers may include a polyimide-based resin, but the present disclosure is not particularly limited thereto.

The driving element layer 120 may be located on the base layer 110. The driving element layer 120 may include a plurality of insulation layers, a plurality of semiconductor patterns, a plurality of conductive patterns, and a plurality of signal lines. The driving element layer 120 may include a pixel driver circuit.

The light-emitting element layer 130 may be located on the driving element layer 120. The light-emitting element layer 130 may include a light-emitting element. For example, the light-emitting element may include an organic light-emitting material, an inorganic light-emitting material, an organic-inorganic light-emitting material, a quantum dot, a quantum rod, a micro-LED, or a nano-LED.

The encapsulation layer 140 may be located on the light-emitting element layer 130. The encapsulation layer 140 may protect the light-emitting element layer 130 or the light-emitting element against moisture, oxygen, and foreign substances, such as dust particles. The encapsulation layer 140 may include at least one encapsulation inorganic layer. The encapsulation layer 140 may have a stack structure of a first encapsulation inorganic layer, an encapsulation organic layer, and a second encapsulation inorganic layer.

The input sensor 200 may be directly located on the display panel 100. The input sensor 200 may use, for example, an electromagnetic induction method and/or a capacitance method to detect user's inputs. The display panel 100 and the input sensor 200 may be formed by a series of processes. In this description, the phrase "directly located" may mean that no third component is located between the input sensor 200 and the display panel 100. For example, there might be no adhesion layer separately located between the input sensor 200 and the display panel 100.

The antireflection layer 300 may reduce a reflectance of external light that is incident from outside the window WM. In one or more embodiments of the present disclosure, the antireflection layer 300 may include a retarder and a polarizer. The retarder may be of a film type or a liquid crystal coating type, and may include a $\lambda/2$ retarder and/or a $\lambda/4$ retarder. The polarizer may also be of a film type or a liquid crystal coating type. The film type may include a stretchable synthetic resin film, and the liquid crystal coating type may include arrayed liquid crystals. The retarder and the polarizer may further include a protection film. Either the retarder and the polarizer or the protection film may be defined as a base layer for the antireflection layer 300.

In one or more embodiments of the present disclosure, the antireflection layer 300 may include color filters. The color filters may be arranged in a certain fashion. The arrangement of the color filters may be determined in consideration of colors of light emitted from pixels included in the display panel 100. The antireflection layer 300 may further include a black matrix adjacent to the color filters. The antireflection layer 300 including the color filters may be directly located on the display panel 100.

In one or more embodiments of the present disclosure, the window WM may include a base layer and a light-shield pattern. The base layer may include a glass substrate and/or a synthetic resin film. The light-shield pattern may partially overlap the base layer. The light-shield pattern may be located on a bottom surface of the base layer, and may substantially define the bezel region (see DD-NDA of FIG. 1) of the display device DD. A zone where no light-shield pattern is located may be defined as the image region (see DD-DA of FIG. 1) of the display device DD.

Figure 3:
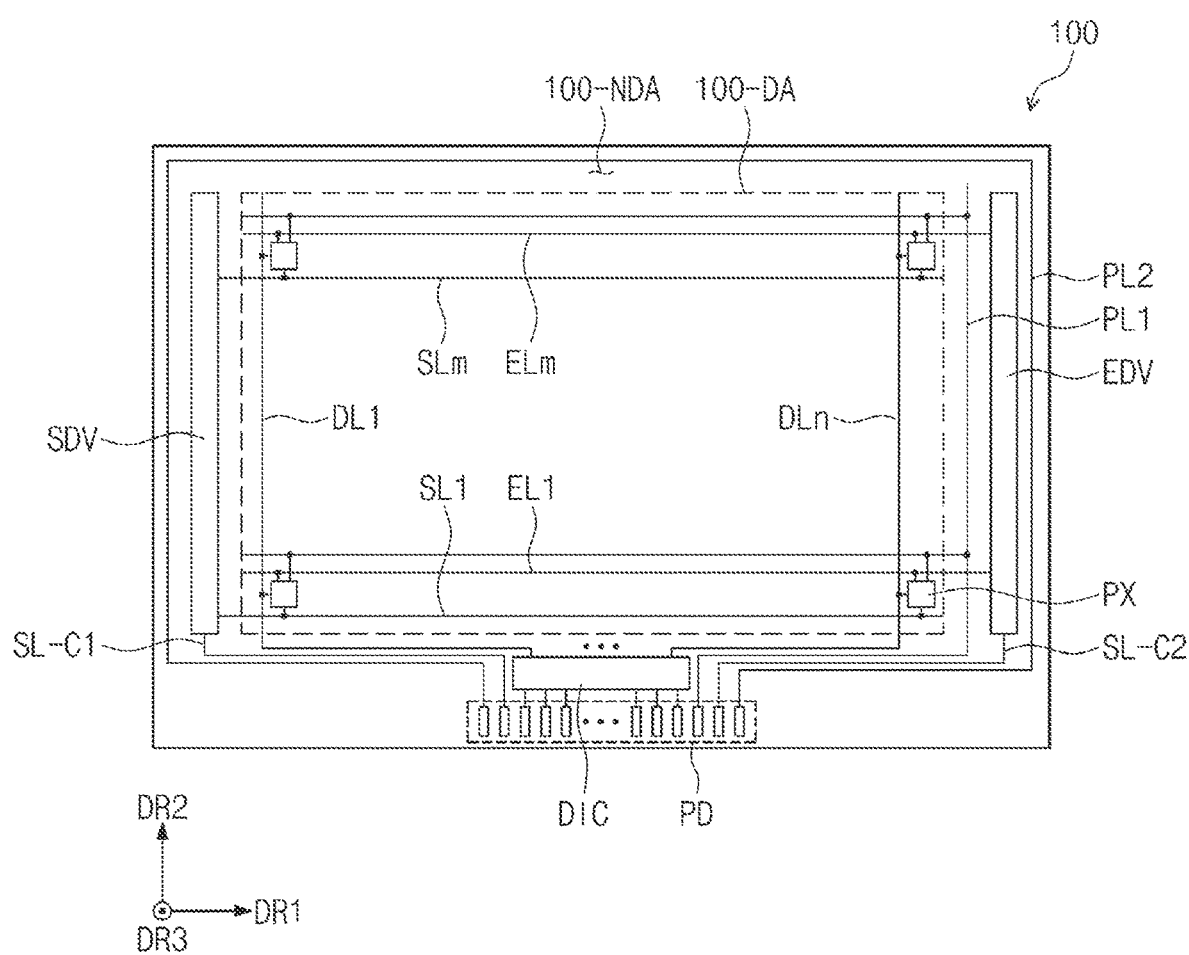
FIG. 3 illustrates a plan view showing a display panel according to one or more embodiments of the present disclosure.

FIG. 3 illustrates a plan view showing the display panel 100 according to one or more embodiments of the present disclosure.

Referring to FIG. 3, the display panel 100 may include a plurality of pixels PX, a scan driver circuit SDV, an emission driver circuit EDV, a plurality of signal lines, and a plurality of pads PD. The plurality of pixels PX may be located on a display region 100-DA. A data driver circuit may be included in a driver chip DIC mounted on a non-display region 100-NDA. The display region 100-DA may correspond to the image region DD-DA of FIG. 1, and the non-display region 100-NDA may correspond to the bezel region DD-NDA. In this description, the phrase "a region or portion corresponds to a region or portion" may mean that a region or portion overlaps a region or portion, without being necessarily limited to that two different regions or portions have the same area. In one or more embodiments of the present disclosure, likewise the scan driver circuit SDV and the emission driver circuit EDV, the data driver circuit may also be integrated on the display panel 100.

The plurality of signal lines may include a plurality of scan lines SL1 to SLm, a plurality of data lines DL1 to DLn, a plurality of emission lines EL1 to ELm, first and second control lines SL-C1 and SL-C2, and first and second power lines PL1 and PL2. The subscripts "m" and "n" are natural numbers equal to or greater than 2.

The scan lines SL1 to SLm may extend in the first direction DR1 to electrically connect with the pixels PX and the scan driver circuit SDV. The data lines DL1 to DLn may extend in the second direction DR2 to electrically connect with the pixels PX and the driver chip DIC. The emission lines EL1 to ELm may extend in the first direction DR1 to electrically connect with the pixels PX and the emission driver circuit EDV.

The first power line PL1 may receive a first power voltage, and the second power line PL2 may receive a second power voltage whose level is less than that of the first power voltage. A second electrode (or a cathode) of the light-emitting element may be connected to the second power line PL2.

The first control line SL-C1 may be connected to the scan driver circuit SDV, and may extend toward a lower end of the display panel 100. The second control line SL-C2 may be connected to the emission driver circuit EDV and may extend toward the lower end of the display panel 100. The pads PD may be located on the non-display region 100-NDA adjacent to the lower end of the display panel 100, and may be closer than the driver chip DIC to the lower end of the display panel 100. The pads PD may be connected to the driver chip DIC and some signal lines.

The scan driver circuit SDV may generate a plurality of scan signals, and the scan signals may be applied through the scan lines SL1 to SLm to the pixels PX. The driver chip DIC may generate a plurality of data voltages, and the data voltages may be applied through the data lines DL1 to DLn to the pixels PX. The emission driver circuit EDV may generate a plurality of emission signals, and the emission signals may be applied through the emission lines EL1 to ELm to the pixels PX. In response to the scan signals, the pixels PX may be provided with the data voltages. In response to the emission signals, the pixels PX may emit light whose brightness corresponds to the data voltages, thereby displaying an image.

Figure 4A:
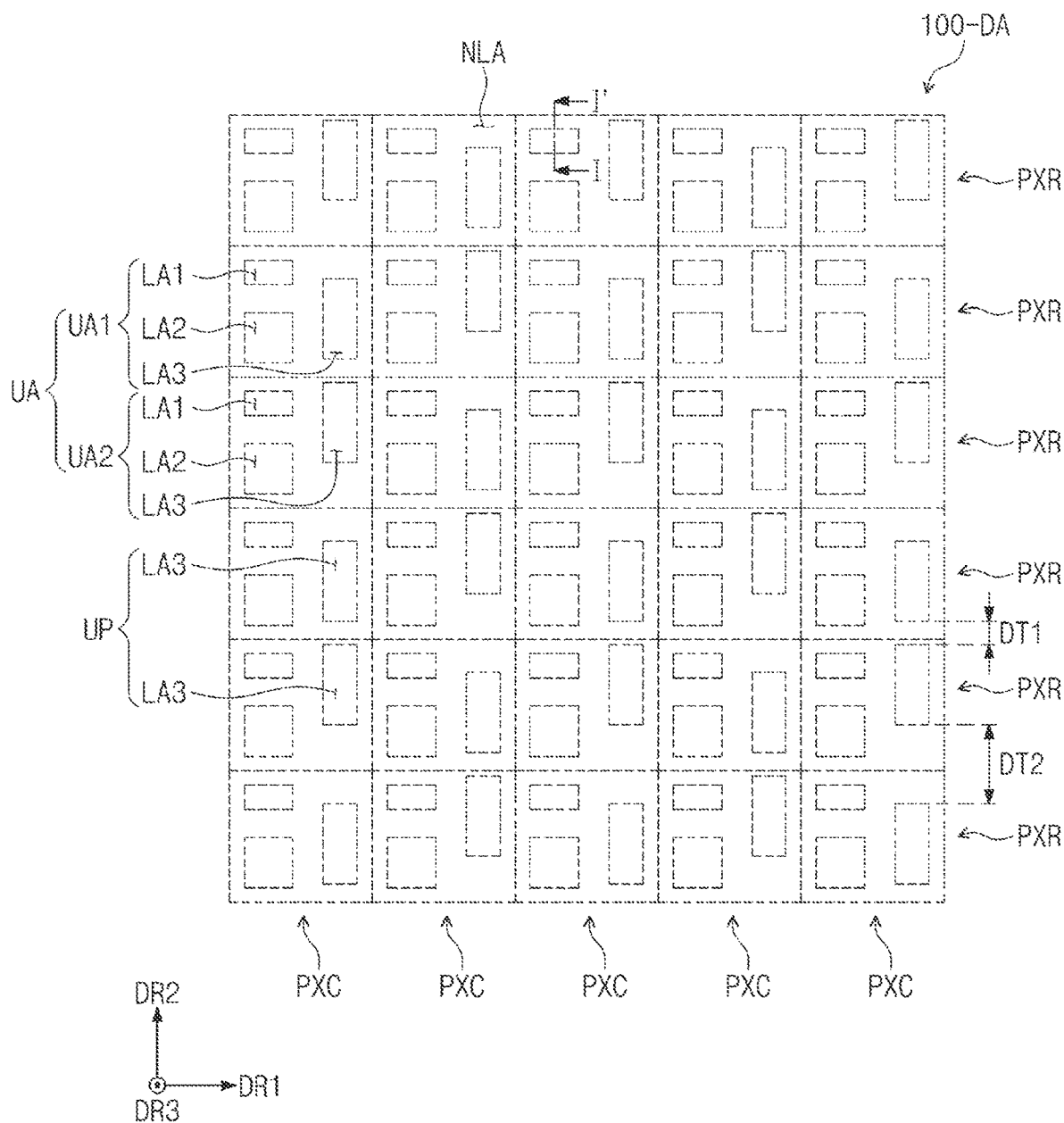
FIGS. 4A to 4C illustrate enlarged plan views showing a display region according to one or more embodiments of the present disclosure.
Figure 4B:
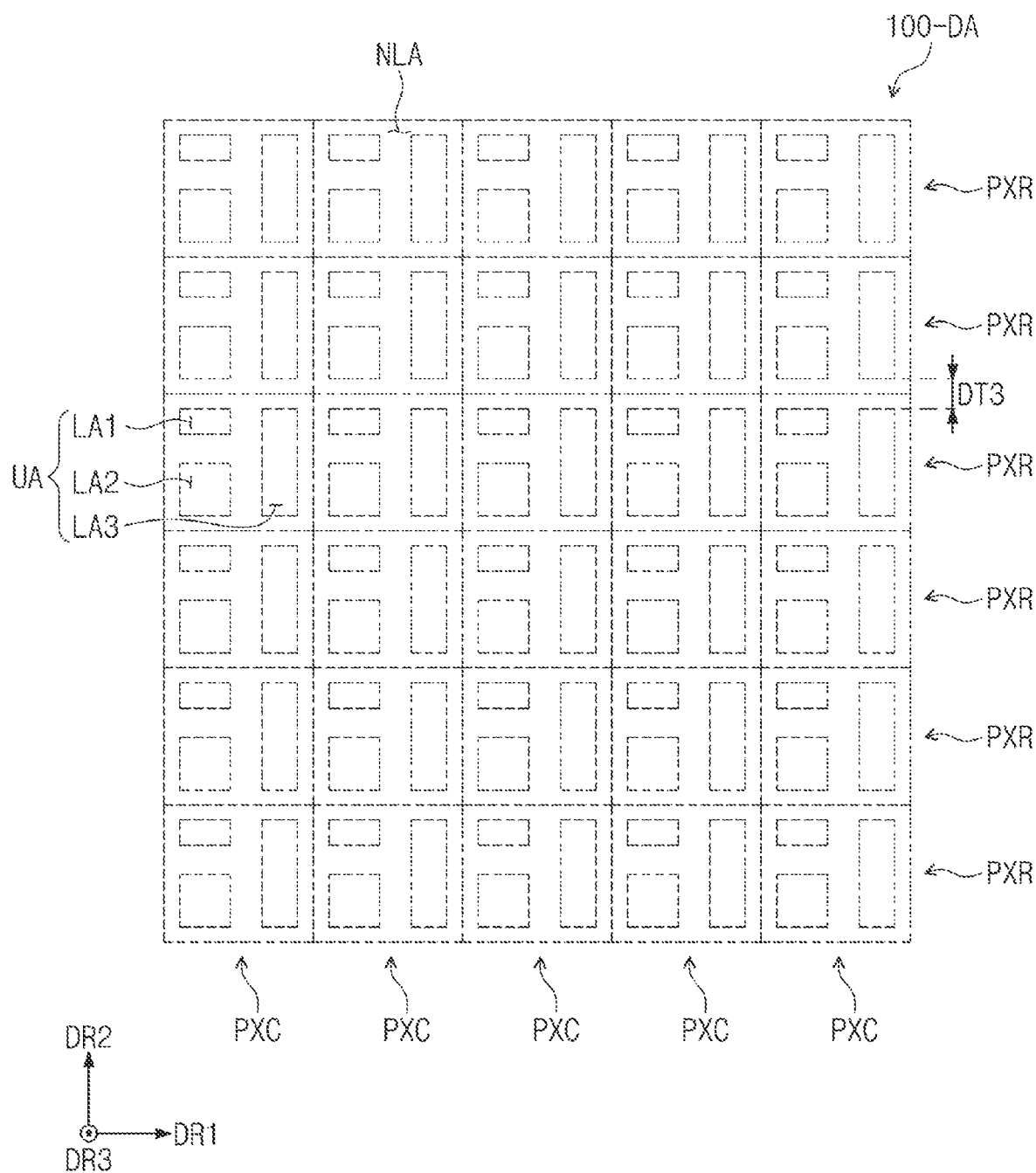
Figure 4C:
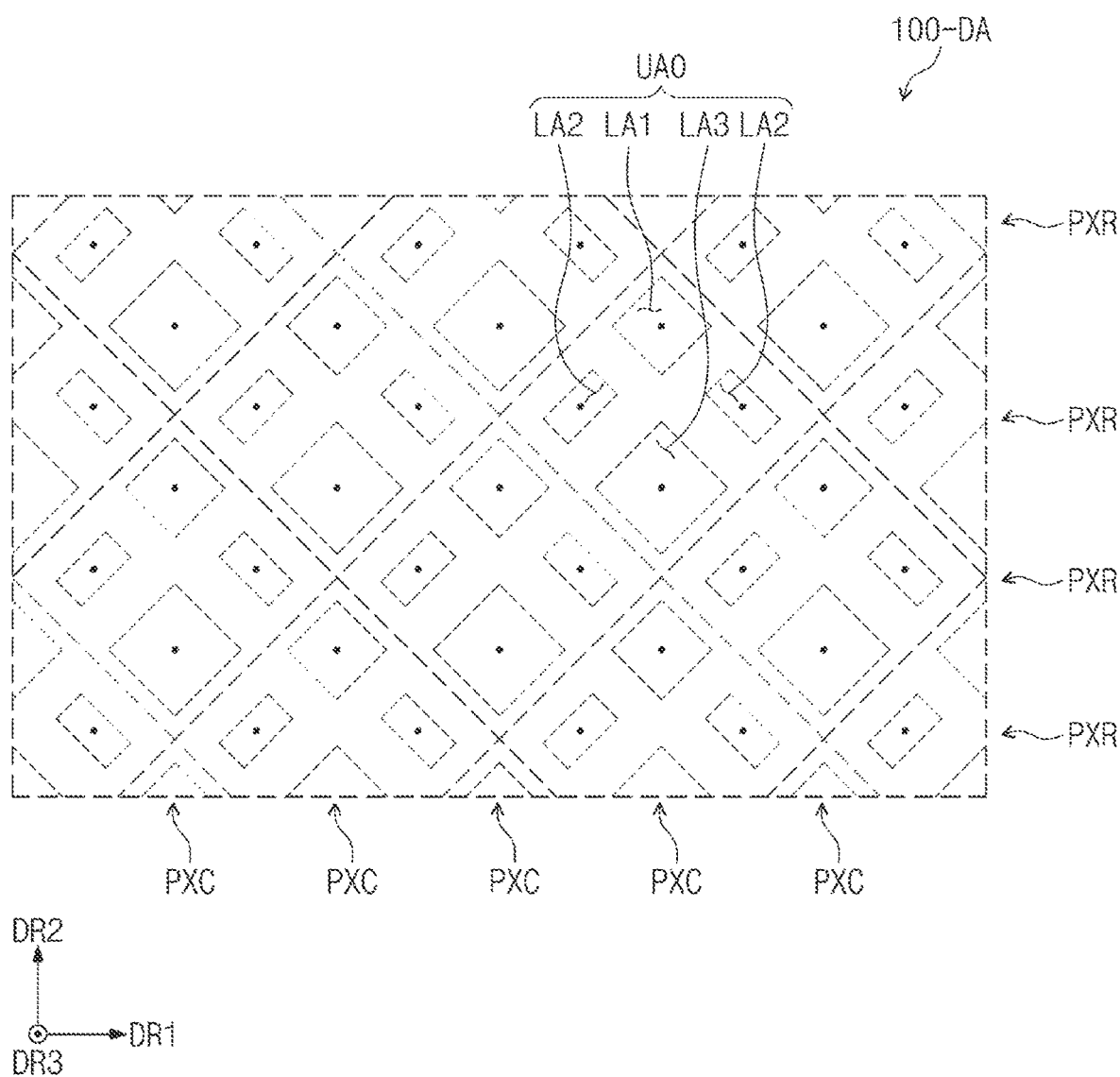

FIGS. 4A to 4C illustrate enlarged plan views showing the display region 100-DA according to one or more embodiments of the present disclosure.

Referring to FIG. 4A, the display region 100-DA may include a plurality of emission regions LA1, LA2, and LA3, and a non-emission region NLA adjacent to the plurality of emission regions LA1, LA2, and LA3. The non-emission region NLA may define a boundary of the emission regions LA1, LA2, and LA3.

The emission regions LA1, LA2, and LA3 may be located to achieve a one-to-one correspondence between with the pixels PX of FIG. 3. Each of the pixels PX may include a light-emitting element, and the emission regions LA1, LA2, and LA3 may be a zone though which light formed in the light-emitting element is emitted. An arrangement relationship between the non-emission region NLA and the emission regions LA1, LA2, and LA3 will be discussed with reference to FIG. 5.

The emission regions LA1, LA2, and LA3 may include a first emission region LA1 (or a first color emission region) that produces first color light, a second emission region LA2 (or a second color emission region) that produces second color light, and the third emission region LA3 (or a third color emission region) that produces third color light. The first color light may be red light, the second color light may be green light, and the third color light may be blue light.

The first, second, and third emission regions LA1, LA2, and LA3 may have different areas from each other, but the present disclosure is not limited thereto. The first emission region LA1 may have a minimum area, and the third emission region LA3 may have a maximum area.

The first emission region LA1, the second emission region LA2, and the third emission region LA3 may define one unit emission region UA. The unit emission region UA may be a repetitive arrangement unit of emission regions located on the display region 100-DA. The unit emission region UA may include a first unit emission region UA1 and a second unit emission region UA2.

Referring to the first and second unit emission regions UA1 and UA2, the first emission region LA1 and the second emission region LA2 may be located in the first direction DR1 on one side (a left side shown in FIG. 4A) of the third emission region LA3. In each of the first and second unit emission regions UA1 and UA2, the second emission region LA2 may be located in the first direction DR1 on one side (a downward side shown in FIG. 4A) of the first emission region LA1.

In the first and second unit emission regions UA1 and UA2, there may be a difference in position of the third emission region LA3 with respect to the first emission region LA1 and the second emission region LA2. Referring to the first unit emission region UA1, the third emission region LA3 may be located on a relatively downside position in the second direction DR2 with respect to the first emission region LA1 and the second emission region LA2. Referring to the second unit emission region UA2, the third emission region LA3 may be located on a relatively upside position in the second direction DR2 with respect to the first emission region LA1 and the second emission region LA2. In the first and second unit emission regions UA1 and UA2, there may be a difference in the degree of shift in the second direction DR2 of the third emission region LA3 with respect to the first emission region LA1 and the second emission region LA2. The third emission region LA3 may be relatively more shifted on the second unit emission region UA2 than on the first unit emission region UA1.

The first unit emission region UA1 and the second unit emission region UA2 may be alternately located along the first direction DR1 in a pixel row PXR. The first unit emission region UA1 and the second unit emission region UA2 may be alternately located along the second direction DR2 in a pixel column PXC. The third emission region LA3 of the first unit emission region UA1 and the third emission region LA3 of the second unit emission region UA2 may be arranged depending on the arrangement of the first and second unit emission regions UA1 and UA2. The third emission regions LA3 of two adjacent first and second unit emission regions UA1 and UA2 may be located relatively close to, and spaced apart from, each other at a first interval DT1.

An emission region pair UP may be defined by the respective third emission regions LA3 of the first and second unit emission regions UA1 and UA2, which third emission regions LA3 are spaced apart from each other at the first interval DT1. The emission region pairs UP may be spaced apart from each other at a second interval DT2 in each pixel column PXC. The second interval DT2 may be greater than the first interval DT1.

The emission region pair UP may be formed by a mask used for deposition. A unitary emission layer may be included in a light-emitting element located on the third emission region LA3 of the first unit emission region UA1 and a light-emitting element located on the third emission region LA3 of the second unit emission region UA2. For example, a single mask may be used to deposit an emission layer located on the third emission region LA3 of the first unit emission region UA1, and to deposit an emission layer located on the third emission region LA3 of the second unit emission region UA2. The mask may have openings that correspond to the emission region pairs UP. A zone between the openings may correspond to a shield region of the mask. As the openings are defined to correspond to the emission region pairs UP, the number of the openings may be reduced to secure a width of the shield region of the mask, which shield region is located between the openings in the second direction DR2. A thin mask may be required to secure a width of its shield region in the second direction DR2 so as to suppress the occurrence of sagging in a deposition process.

This may be seen by comparing a third interval DT3 between the third emission regions LA3 illustrated in FIG. 4B. Referring to FIG. 4B, one type of unit emission region UA may be located on the display region 100-DA. The third interval DT3 between the third emission regions LA3 of neighboring unit emission regions UA in the pixel column PXC may be less than the second interval DT2 of FIG. 4B. A mask used for forming the third emission regions LA3 of FIG. 4B may have a larger number of openings of the mask, and may have a relatively small width of a light-shield region of the mask. This may be caused by the fact that a mask for forming emission layers on the third emission regions LA3 shown in FIG. 4B has openings that correspond to the third emission regions LA3.

Referring to FIG. 4C, one type of unit emission region UA0 may be located on the display region 100-DA. The unit emission region UA0 may include second emission regions LA2 that are located spaced apart in the first direction DR1 from each other, and may also include a first emission region LA1 and a third emission region LA3 that are located spaced apart in the second direction DR2 from each other. The four emission regions LA1, LA2, and LA3 of the unit emission region UA0 may be arranged in a rhombic shape. The unit emission regions UA0 may be arrayed along the first direction DR1 in the pixel rows PXR. The unit emission regions UA0 may be located staggered along the first direction DR1 in neighboring pixel rows PXR. The unit emission regions UA0 may be located staggered along the second direction DR2 in neighboring pixel columns PXC.

Figure 5:
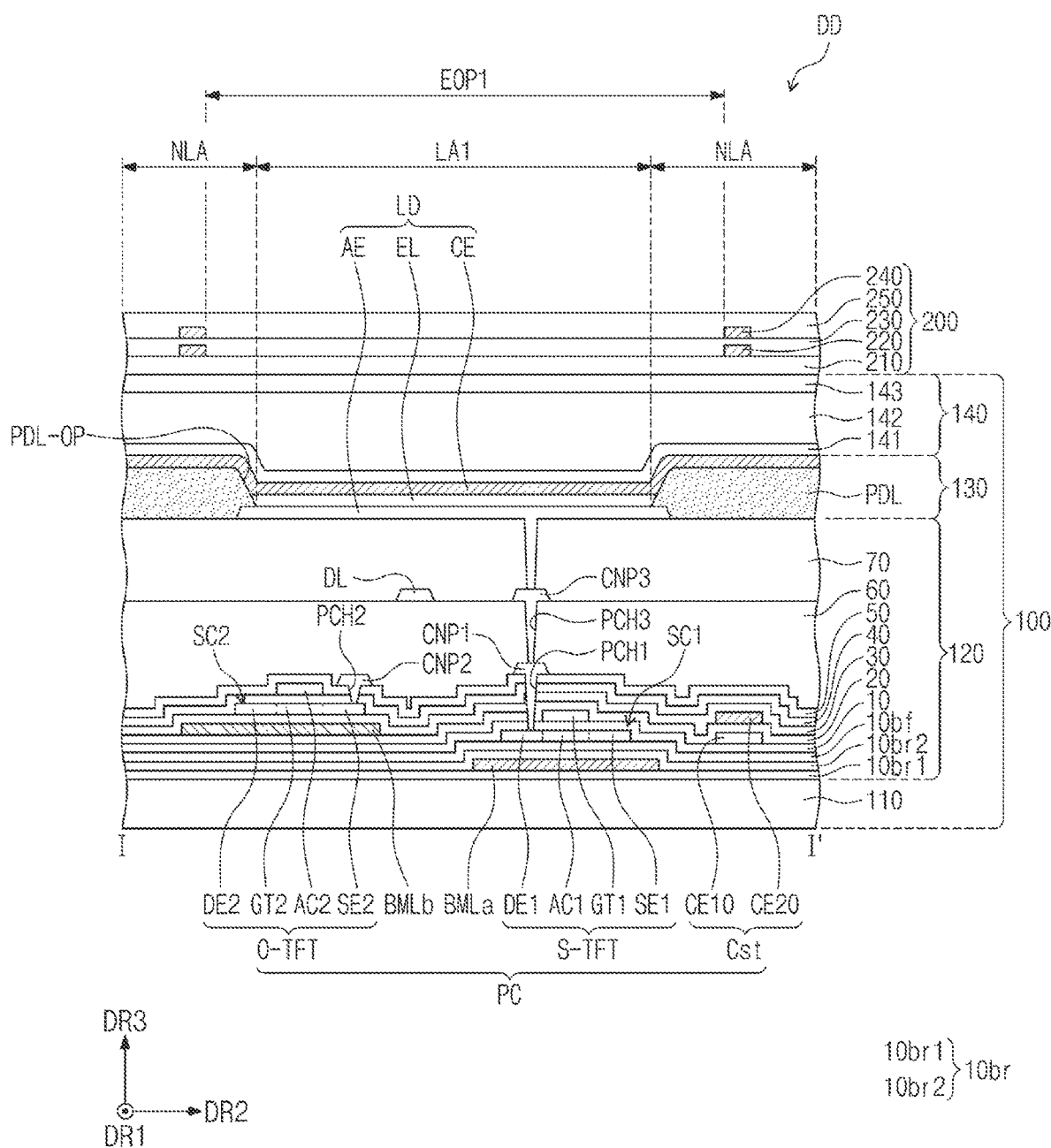
FIG. 5 illustrates a cross-sectional view showing a display device taken along the line I-I' of FIG. 4A.

FIG. 5 illustrates a cross-sectional view showing the display device DD taken along the line I-I' of FIG. 4A. FIG. 5 omits an illustration of some components of the display device DD, for example, the antireflection layer 300, the adhesion layer PSA, and the window WM of FIG. 2.

A plurality of pixel driving elements may be included in a pixel driver circuit PC that drives a light-emitting element LD. The pixel driver circuit PC may include a capacitor Cst and a plurality of transistors S-TFT and O-TFT. FIG. 5 depicts a silicon transistor S-TFT and an oxide transistor O-TFT as examples of a transistor. The pixel driver circuit PC of FIG. 5 is merely example, and a configuration of the pixel driver circuit PC is not limited thereto. The pixel driver circuit PC may include only one of the silicon transistor S-TFT and the oxide transistor O-TFT.

The base layer 110 may have a single-layered structure. The base layer 110 may include a synthetic resin, such as polyimide. The base layer 110 may be formed by coating a synthetic resin layer on a work substrate (or a carrier substrate). A subsequent process may be performed to form the display module DM, and then the work substrate may be removed.

A barrier layer 10*br* may be located on the base layer 110. The barrier layer 10*br* may reduce or prevent introduction of foreign substances from the outside. The barrier layer 10*br* may include at least one inorganic layer. The barrier layer 10*br* may include a silicon oxide layer and a silicon nitride layer. Each of the silicon oxide layer and the silicon nitride layer may be provided in plural, and the silicon oxide layers and the silicon nitride layers may be alternately stacked with each other. The barrier layer 10*br* may include a lower barrier layer 10*br*1 and an upper barrier layer 10*br*2. A first shield electrode BMLa may be located between the lower barrier layer 10*br*1 and the upper barrier layer 10*br*2. The first shield electrode BMLa may be located to correspond to the silicon transistor S-TFT. The first shield electrode BMLa may include metal, for example, molybdenum.

The first shield electrode BMLa may receive a bias voltage. The first shield electrode BMLa may receive a first power voltage. The first shield electrode BMLa may reduce or prevent the likelihood of the silicon transistor S-TFT being affected by a polarization-induced electric potential. The first shield electrode BMLa may reduce or prevent external light reaching the silicon transistor S-TFT. In one or more embodiments of the present disclosure, the first shield electrode BMLa may be a floating electrode that is isolated from other electrodes or wiring lines.

A buffer layer 10*bf* may be located on the barrier layer 10*br*. The buffer layer 10*bf* may reduce or prevent metal elements or impurities from diffusing from the base layer 110 toward an overlying first semiconductor pattern SC1. The buffer layer 10*bf* may include at least one inorganic layer. The buffer layer 10*bf* may include a silicon oxide layer and a silicon nitride layer.

The first semiconductor pattern SC1 may be located on the buffer layer 10*bf*. The first semiconductor pattern SC1 may include a silicon semiconductor. For example, the silicon semiconductor may include amorphous silicon or polycrystalline silicon. For example, the first semiconductor pattern SC1 may include low-temperature polysilicon.

The first semiconductor pattern SC1 may have electrical properties that are changed based on whether the first semiconductor pattern SC1 is doped or not. The first semiconductor pattern SC1 may include a first section whose conductivity is relatively high and a second section whose conductivity is relatively low. The first section may be doped with n-type or p-type impurities. The second section may be an undoped section or may be a doped section implanted with impurities whose concentration is less than that of impurities doped in the first section. The silicon transistor S-TFT may include a source section SE1, a channel section AC1 (or active section), and a drain section DE1, all of which are formed from the first semiconductor pattern SC1. The source section SE1 and the drain section DE1 may extend in opposite directions from the channel section AC1 when viewed in a cross-sectional view.

A first insulation layer 10 may be located on the buffer layer 10*bf*. The first insulation layer 10 may cover the first semiconductor pattern SC1. The first insulation layer 10 may be an inorganic layer. The first insulation layer 10 may be a single-layered silicon oxide layer. Like the first insulation layer 10, an inorganic layer of the driving element layer 120, which will be discussed below, may have a single-layered or multi-layered structure, and may include at least one of the materials mentioned above, but the present disclosure is not limited thereto.

A gate GT1 of the silicon transistor S-TFT may be located on the first insulation layer 10. The gate GT1 may be a portion of a metal pattern. The gate GT1 may overlap the channel section AC1. The gate GT1 may serve as a mask in a process where the first semiconductor pattern SC1 is doped. The first insulation layer 10 may be provided thereon with a first electrode CE10 of the capacitor Cst. In one or more other embodiments, the first electrode CE10 and the gate GT1 may collectively have a single unitary shape.

The first insulation layer 10 may be provided thereon with a second insulation layer 20 that covers the gate GT1. In one or more embodiments of the present disclosure, the second insulation layer 20 may be provided thereon with an upper electrode that overlaps the gate GT1. The second insulation layer 20 may be provided thereon with a second electrode CE20 that overlaps the first electrode CE10. The upper electrode and the second electrode CE20 may collectively have a single unitary shape when viewed in plan.

A second shield electrode BMLb may be located on the second insulation layer 20. The second shield electrode BMLb may be located to correspond to the oxide transistor O-TFT. In one or more embodiments of the present disclosure, the second shield electrode BMLb may be omitted. According to one or more embodiments of the present disclosure, the first shield electrode BMLa may extend to a location below the oxide transistor O-TFT to replace the second shield electrode BMLb.

A third insulation layer 30 may be located on the second insulation layer 20. A second semiconductor pattern SC2 may be located on the third insulation layer 30. The second semiconductor pattern SC2 may include a channel section AC2 of the oxide transistor O-TFT. The second semiconductor pattern SC2 may include a metal oxide semiconductor. The second semiconductor pattern SC2 may include transparent conductive oxide (TCO), such as indium tin oxide (ITO), indium zinc oxide (IZO), indium gallium zinc oxide (IGZO), zinc oxide (ZnOx), or indium oxide ($In_2O_3$).

The metal oxide semiconductor may include a plurality of sections SE2, AC2, and DE2 that are distinguished depending on whether the transparent conductive oxide is reduced or not. A section (or a reducing section) where the transparent conductive oxide is reduced may have conductivity that is greater than that of a section (or a non-reducing section) where the transparent conductive oxide is not reduced. The reducing section may substantially serve as a signal line or a source/drain of a transistor. The non-reducing section may substantially correspond to a semiconductor section (or a channel) of a transistor.

A fourth insulation layer 40 may be located on the third insulation layer 30. The fourth insulation layer 40 may cover the second semiconductor pattern SC2. In one or more embodiments of the present disclosure, the fourth insulation layer 40 may be a dielectric pattern that overlaps a gate GT2 of the oxide transistor O-TFT and exposes a source section SE2 and a drain section DE2 of the oxide transistor O-TFT.

The gate GT2 of the oxide transistor O-TFT may be located on the fourth insulation layer 40. The gate GT2 of the oxide transistor O-TFT may be a portion of a metal pattern. The gate GT2 of the oxide transistor O-TFT may overlap the channel section AC2 of the oxide transistor O-TFT. The fourth insulation layer 40 may be provided thereon with a fifth insulation layer 50 that covers the gate GT2. Each of the first to fifth insulation layers 10 to 50 may be an inorganic layer.

A first connection pattern CNP1 and a second connection pattern CNP2 may be located on the fifth insulation layer 50. The first connection pattern CNP1 and the second connection pattern CNP2 may be formed by the same process to have the same material and stack structure. The first connection pattern CNP1 may be coupled to the drain section DE1 of the silicon transistor S-TFT through a first pixel contact hole PCH1 that penetrates the first, second, third, fourth, and fifth insulation layers 10, 20, 30, 40, and 50. The second connection pattern CNP2 may be coupled to the source section SE2 of the oxide transistor O-TFT through a second pixel contact hole PCH2 that penetrates the fourth and fifth insulation layers 40 and 50. The connection relationship of the first connection pattern CNP1 with respect to the silicon transistor S-TFT is not limited to that discussed above, and likewise the connection relationship of the second connection pattern CNP2 with respect to the oxide transistor O-TFT is not limited to that discussed above.

A sixth insulation layer 60 may be located on the fifth insulation layer 50. A third connection pattern CNP3 may be located on the sixth insulation layer 60. The third connection pattern CNP3 may be coupled to the first connection pattern CNP1 through a third pixel contact hole PCH3 that penetrates the sixth insulation layer 60. A data line DL may be located on the sixth insulation layer 60. The sixth insulation layer 60 may be provided thereon with a seventh insulation layer 70 that covers the third connection pattern CNP3 and the data line DL. The third connection pattern CNP3 and the data line DL may be formed by the same process to have the same material and stack structure. Each of the sixth and seventh insulation layers 60 and 70 may be an organic layer.

The light-emitting element LD may include an anode AE (or a first electrode), an emission layer EL, and a cathode CE (or a second electrode). The anode AE of the light-emitting element LD may be located on the seventh insulation layer 70. The electrode AE may be a transmissive electrode, transflective electrode, or a reflective electrode. The anode AE may have a stack structure in which ITO, Ag, and ITO are sequentially stacked. The anode AE and the cathode CE may be interchangeably positioned.

A pixel definition layer PDL may be located on the seventh insulation layer 70. The pixel definition layer PDL may be an organic layer. The pixel definition layer PDL may exhibit light-absorbing properties and may have, for example, a black color. The pixel definition layer PDL may include a black coloring agent. The black coloring agent may include a black dye or a black pigment. The black coloring agent may include a carbon black, metal, such as chromium, or oxide thereof. The pixel definition layer PDL may correspond to a light-shield pattern having light-shield properties.

The pixel definition layer PDL may cover a portion of the anode AE. For example, the pixel definition layer PDL may have an opening PDL-OP that is defined to expose a portion of the anode AE. The emission region LA1 may be defined to correspond to the opening PDL-OP. FIG. 5 depicts one emission region LA1 that corresponds to the first emission region LA1 of FIG. 4A. A cross section that corresponds to each of the second emission region LA2 and the third emission region LA3 may be substantially similar to that of FIG. 5. However, the second emission region LA2 and the third emission region LA3 may include an emission layer EL whose material is different from that of the emission layer EL included in the first emission region LA1. In addition, referring to the emission region pair UP of FIG. 4A, the pixel definition layer PDL may be located between the respective third emission regions LA3 of the first and second unit emission regions UA1 and UA2. The emission layer EL located on the respective third emission regions LA3 of the first and second unit emission regions UA1 and UA2 may be located on the pixel definition layer PDL located between the third emission regions LA3.

In one or more embodiments of the present disclosure, a hole control layer may be located between the anode AE and the emission layer EL. The hole control layer may include a hole transport layer, and may further include a hole injection layer. An electron control layer may be located between the emission layer EL and the cathode CE. The electron control layer may include an electron transport layer, and may further include an electron injection layer.

The encapsulation layer 140 may cover the light-emitting element LD. The encapsulation layer 140 may include an encapsulation inorganic layer 141, an encapsulation organic layer 142, and another encapsulation inorganic layer 143 that are sequentially stacked, but layers included in the encapsulation layer 140 are not necessarily limited thereto. The encapsulation inorganic layers 141 and 143 may include a silicon nitride layer, a silicon oxynitride layer, a silicon oxide layer, a titanium oxide layer, or an aluminum oxide layer. Each of the encapsulation inorganic layers 141 and 143 may have a multi-layered structure. The encapsulation organic layer 142 may include an acryl-based organic layer, but the present disclosure is not limited thereto.

The input sensor 200 may include at least one conductive layer (or at least one sensor conductive layer) and at least one insulation layer (or at least one sensor insulation layer). The input sensor 200 may include a first insulation layer 210 (or a first sensor insulation layer), a first conductive layer 220 (or a first sensor conductive layer), a second insulation layer 230 (or a second sensor insulation layer), a second conductive layer 240 (or a second sensor conductive layer), and a third insulation layer 250 (or a third sensor insulation layer). FIG. 5 roughly depicts a conductive line of the first conductive layer 220, and a conductive line of the second conductive layer 240.

The first insulation layer 210 may be directly located on the display panel 100. The first insulation layer 210 may be an inorganic layer including at least one selected from silicon nitride, silicon oxynitride, and silicon oxide. Each of the first and second conductive layers 220 and 240 may have a single-layered structure or a multi-layered structure in which layers are stacked along the third direction DR3. The first and second conductive layers 220 and 240 may include conductive lines that define a mesh-shaped electrode. A conductive line of the first conductive layer 220 and a conductive line of the second conductive layer 240 may be connected, depending on position, through a contact hole that penetrates the second insulation layer 230.

The first and second conductive layers 220 and 240 each having a single-layered structure may include a metal layer or a transparent conductive layer. The metal layer may include molybdenum, silver, titanium, copper, aluminum, or any alloy thereof. The transparent conductive layer may include transparent conductive oxide, such as indium tin oxide (ITO), indium zinc oxide (IZO), zinc oxide (ZnOx), or indium zinc tin oxide (IZTO). Additionally, or alternatively, the transparent conductive layer may include a graphene, a metal nano-wire, or a conductive polymer, such as poly(3, 4-ethylenedioxythiophene) or PEDOT.

The first and second conductive layers 220 and 240 each having a multi-layered structure may include metal layers. The metal layers may include, for example, tri-layered structure of titanium/aluminum/titanium. The multi-layered conductive layer may include at least one metal layer and at least one transparent conductive layer. The second insulation layer 230 may be located between the first conductive layer 220 and the second conductive layer 240. The third insulation layer 250 may cover the second conductive layer 240. In one or more embodiments of the present disclosure, the third insulation layer 250 may be omitted. The second and third insulation layers 230 and 250 may each include an inorganic layer or an organic layer.

Figure 6:
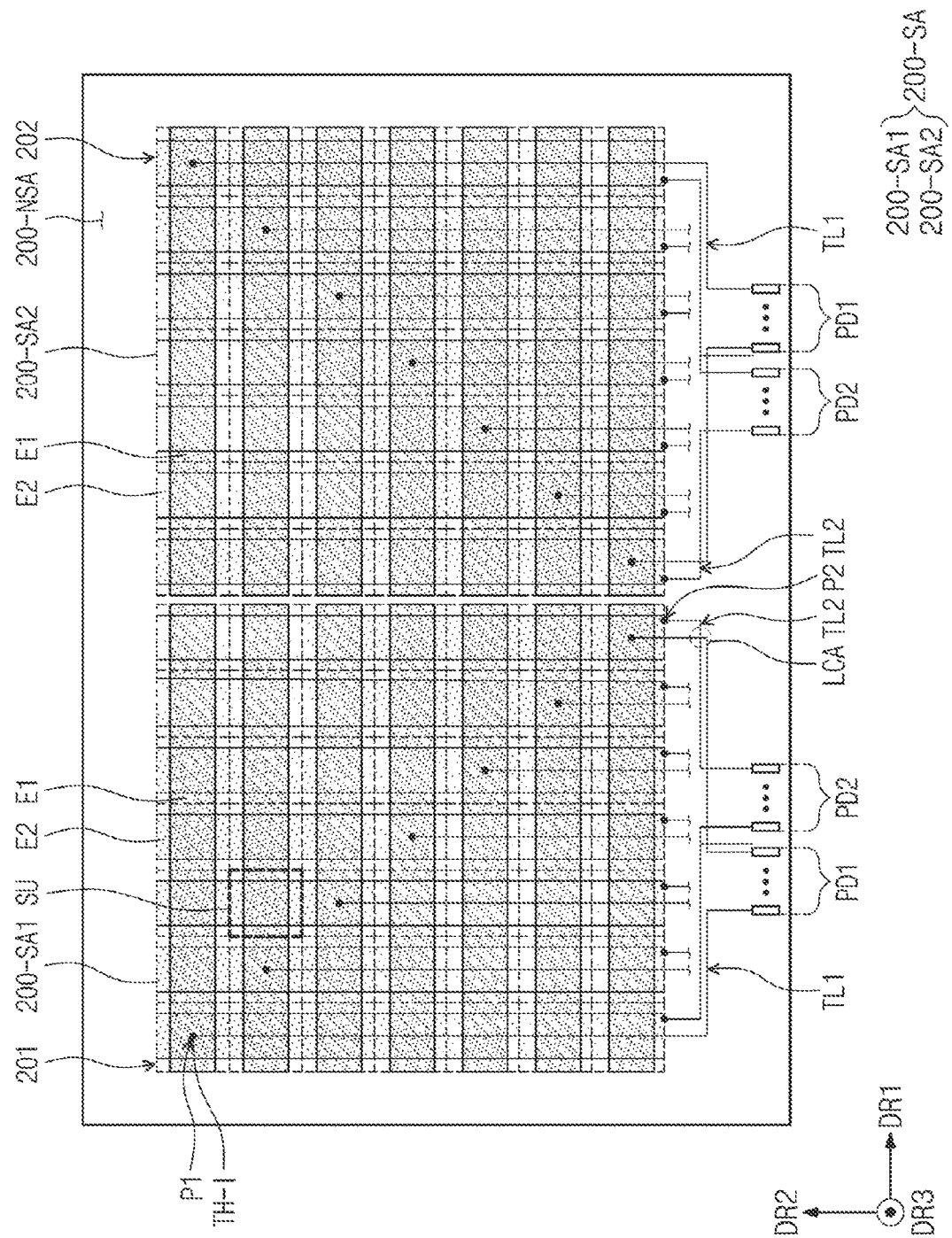
FIG. 6 illustrates a plan view showing an image sensor according to one or more embodiments of the present disclosure.
Figure 7:
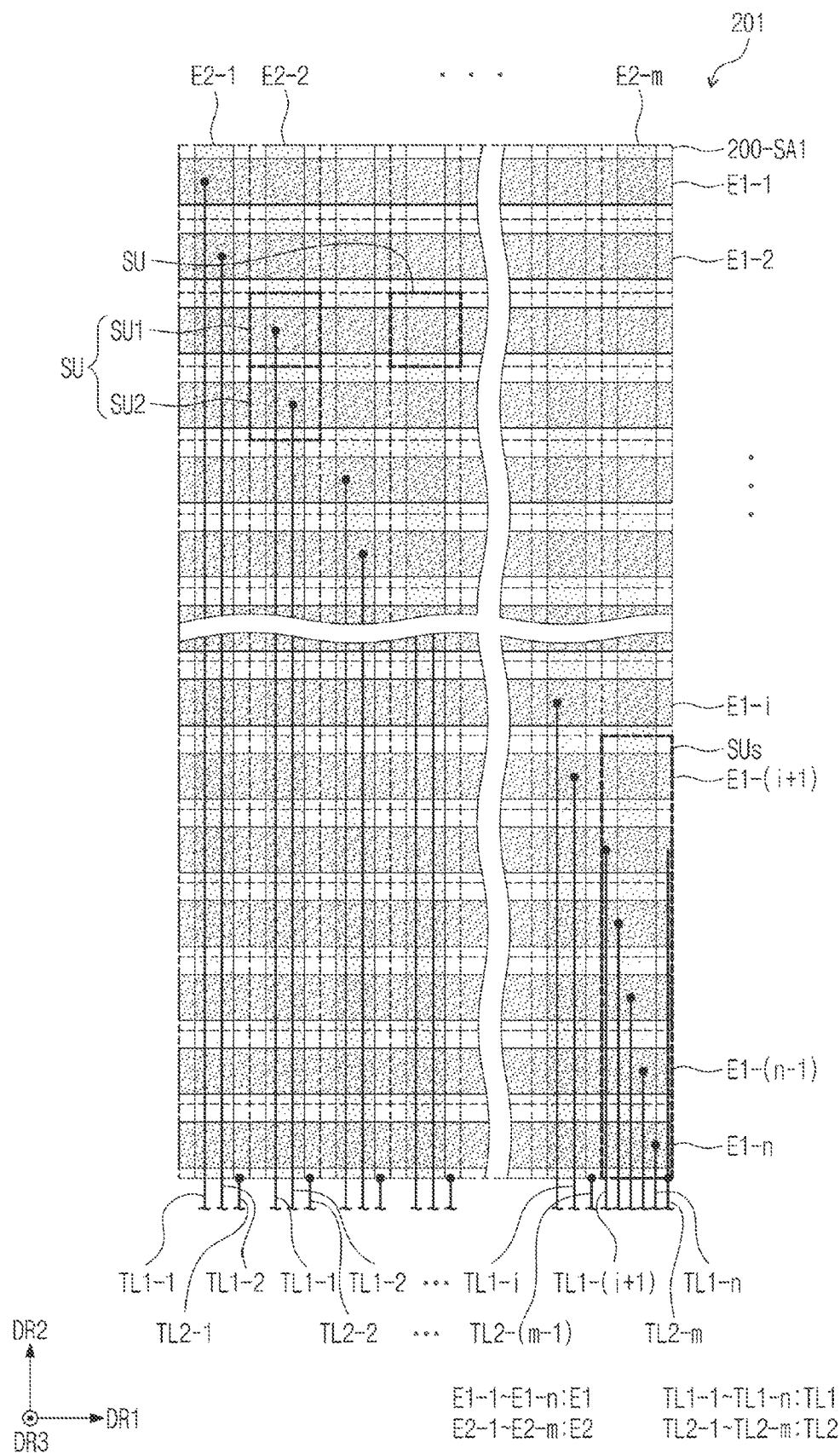
FIG. 7 illustrates a detailed plan view showing a first input sensor of FIG. 6.

FIG. 6 illustrates a plan view showing the input sensor 200 according to one or more embodiments of the present disclosure. FIG. 7 illustrates a detailed plan view showing a first input sensor 201 of FIG. 6.

The input sensor 200 may include a sensing region 200-SA and a non-sensing region 200-NSA. The sensing region 200-SA may correspond to the display region 100-DA of FIG. 3, and the non-sensing region 200-NSA may correspond to the non-display region 100-NSA of FIG. 3. In one or more embodiments of the present disclosure, the sensing region 200-SA and the display region 100-DA may have the same area, and the non-sensing region 200-NSA and the non-display region 100-NDA may have the same area.

The input sensor 200 may include a first input sensor 201 and a second input sensor 202. The first input sensor 201 and the second input sensor 202 may respectively overlap a first sensing region 200-SA1 and a second sensing region 200-SA2 of the first sensing region 200-SA1. The first sensing region 200-SA1 may overlap a first region of the display region 100-DA, and the second sensing region 200-SA2 may overlap a second region of the display region 100-DA.

In one or more embodiments of the present disclosure, the input sensor 200 may include only the first input sensor 201. The input sensor 200 may further include a third input sensor that overlaps a third sensing region. The third input sensor may be located either between the first input sensor 201 and the second input sensor 202, on a left side of the first input sensor 201, or on a right side of the second input sensor 202.

The first input sensor 201 and the second input sensor 202 may have substantially the same configuration. The first input sensor 201 and the second input sensor 202 are illustrated by way of example as being laterally symmetrically located, but the present disclosure is not particularly limited thereto. The input sensor 200 will be described below based on the first input sensor 201.

The first input sensor 201 may include first sensing electrodes E1 (referred to hereinafter as a first group electrode) and second sensing electrodes E2 (referred to hereinafter as a second group electrode). As a plurality of input sensors 201 and 202 are located on the sensing region 200-SA, there may be a reduction in length of an electrode included in at least one of the first group electrode E1 and the second group electrode E2. This may cause a reduction in resistance of the electrode and load of the input sensor 200. When one first sensing electrode E1 is located extending in the first direction DR1 in common on the first sensing region 200-SA1 and the second sensing region 200-SA2, the first sensing electrode E1 may suitably reduce in resistance. The first input sensor 201 and the second input sensor 202 may operate with each other or independently of each other.

The first group electrode E1 may include a plurality of electrodes, and the second group electrode E2 may include a plurality of electrodes. The electrodes of the first group electrode E1 may extend substantially in the first direction DR1, and may be arranged in the second direction DR2. The phrase "the electrodes of the first group electrode E1 extend substantially in the first direction DR1" might not necessarily indicate that the first sensing electrodes E1 extend linearly, but may also mean that ends of the electrodes of the first group electrode E1 are located spaced apart in the first direction DR1 from other ends of the electrodes of the first group electrode E1. The electrodes of the second group electrode E2 may extend substantially in the second direction DR2, and may be arranged in the first direction DR1.

A sensing unit SU may be defined at every one of intersections between the electrodes of the first group electrode E1 and the electrodes of the second group electrode E2. Each of the first sensing region 200-SA1 and the second sensing region 200-SA2 of FIG. 6 may be divided into a plurality of sensing units SU that are arranged in a matrix shape. However, the sensing units SU might not necessarily have the same area and shape. At least one of the sensing units SU may have a relatively small area. For example, the sensing unit SU located on a corner of the sensing region 200-SA may have a relatively small area. The display region 100-DA and the sensing region 200-SA may have a rounded corner. In addition, a certain sensing region 200-SA may have an opening that serves as a traveling path of light.

The first input sensor 201 may include a first group line TL1 electrically connected to the first group electrode E1, and a second group line TL2 electrically connected to the second group electrode E2. The first group line TL1 may include a plurality of trace lines, and the second group line TL2 may include a plurality of trace lines. A one-to-one correspondence may be established in an electrical connection between the trace lines of the first group line TL1 and the electrodes of the first group electrode E1. The trace line of the first group line TL1 may be connected at a first point P1 to its corresponding electrode of the first group electrode E1, and the trace line of the second group line TL2 may be connected at a second point P2 to its corresponding electrode of the second group electrode E2. The first point P1 may be a site where a contact hole TH-I is formed, as discussed below, but the second point P2 is not limited thereto. The second point P2 may be a section where no contact hole is formed. For example, the trace line of the second group line TL2 and its corresponding electrode of the second group electrode E2 may be formed from a conductive layer (e.g., the second conductive layer 240 of FIG. 5) located on the same layer.

One end of the trace line of the first group line TL1 may be connected to a first pad PD1, and one end of the trace line of the second group line TL2 may be connected to a second pad PD2. Each of the first pad PD1 and the second pad PD2 may be a conductive pattern that is located on a layer that is different from that of at least a portion of its corresponding trace line.

A driving signal may be received by an electrode included in one of the first group electrode E1 and the second group electrode E2. A current may flow from an electrode of one of the first group electrode E1 and the second group electrode E2, through a mutual capacitor defined between the first group electrode E1 and the second group electrode E2, to an electrode of the other of the first group electrode E1 and the second group electrode E2. A driving signal may be received by only one of the first group electrode E1 and the second group electrode E2, but alternatively, a driving signal may be received by the first group electrode E1 in a first period and by the second group electrode E2 in a second period.

FIG. 6 depicts an intersection area LCA between the first group line TL1 and the second group line TL2. At the intersection area LCA, a bridge pattern may be included in one of the first group line TL1 and the second group line TL2. The bridge pattern may be located on a layer different from those of the first group line TL1 and the second group line TL2, and thus no short-circuit may be created between the first group line TL1 and the second group line TL2.

The first group line TL1 may overlap the first sensing region 200-SA1. The second group line TL2 connected to an end of the second group electrode E2 might not overlap the first sensing region 200-SA1. Even if the second group line TL2 is not connected to the end of the second group electrode E2, the second point P2 may be located closer to the non-sensing region 200-NSA than the first point P1. As the second point P2 is located not to overlap the first sensing region 200-SA1, the second point P2 may be located relatively close to the non-sensing region 200-NSA even if the second point P2 overlaps the first sensing region 200-SA1. However, because the first point P1 inevitably overlaps the first sensing region 200-SA1, the first point P1 may have a limitation in being located adjacent to the non-sensing region 200-NSA.

The first input sensor 201 will be further discussed in detail with reference to FIG. 7.

Referring to FIG. 7, the first group electrode E1 may include a first electrode E1-1 to an $n^{th}$ electrode E1-$n$, and the second group electrode E2 may include a first electrode E2-1 and an $m^{th}$ electrode E2-$m$. The first group line TL1 may include a first trace line TL1-1 (referred to hereinafter as a first line) to an $n^{th}$ trace line TL1-$n$ (referred to hereinafter as an $n^{th}$ line), and the second group line TL2 may include a first trace line TL2-1 (referred to hereinafter as a first line) to an $m^{th}$ trace line TL2-$m$ (referred to hereinafter as an $m^{th}$ line). The first trace line TL1-1 to the $n^{th}$ trace line TL1-$n$ of the first group line TL1 may be correspondingly electrically connected to the first to $n^{th}$ electrodes E1-1 to E1-$n$ of the first group electrode E1. The first trace line TL2-1 to the $m^{th}$ trace line TL2-$m$ of the second group line TL2 may be correspondingly electrically connected to the first to $m^{th}$ electrodes E2-1 to E2-$m$ of the second group electrode E2.

The first sensing region 200-SA1 may include sensing units SU that are located in an n×m arrangement. Every one of the sensing units SU that are located in the n×m arrangement may have an intersection area where one of the first electrode E1-1 to the $n^{th}$ electrode E1-$n$ of the first group electrode E1 intersects one of the first electrode E2-1 to the $m^{th}$ electrode E2-$m$ of the second group electrode E2.

When viewed in the second direction DR2, the first electrode E1-1 of the first group electrode E1 may be located farthest away from the pads (see PD1 and PD2 of FIG. 6), and the $n^{th}$ electrode E1-$n$ of the first group electrode E1 may be located closest to the pads (see PD1 and PD2 of FIG. 6). Therefore, the first line TL1-1 to the $n^{th}$ line TL1-$n$ of the first group line TL1 may have their lengths and resistances that decrease from the first line TL1-1 toward the $n^{th}$ line TL1-$n$. When viewed in from the first line TL1-1 toward the $n^{th}$ line TL1-$n$, there may be a reduction in the number of the first to $n^{th}$ electrodes E1-1 and E1-$n$ of the first group electrode E1 that correspond to (or overlap with) the first line TL1-1 to the $n^{th}$ line TL1-$n$.

The letters n and m may each be a natural number equal to or greater than 2, the letter n may be greater than the letter m, and the letter n might not be an integer multiple of the letter m. Therefore, the first line TL1-1 to the $n^{th}$ line TL1-$n$ of the first group line TL1 might not be uniformly located with respect to the first electrode E2-1 to the $m^{th}$ electrode E2-$m$ of the second group electrode E2.

For example, the following will describe a case where the letter n is 43 and the letter m is 20. When the first line TL1-1 to the forty-third line TL1-43 of the first group line TL1 are located at a regular interval in the first direction DR1, there may be a difference in overlapping positions of the first to forty-third lines TL1-1 to TL1-43 of the first group line TL1 with their respective corresponding first to twentieth electrodes E2-1 to E2-20 of the second group electrode E2, and there may a partial difference in the number of the corresponding lines.

For example, the following will describe a comparative case where the letter n is 40 and the letter m is 20. When the first line TL1-1 to the forties line TL1-40 of the first group line TL1 are located at a regular interval in the first direction DR1, two lines may be located on every one of the first electrode E2-1 to the twentieth electrode E2-20 of the second group electrode E2, and the same overlapping position may be given to the two lines located on every one of the first electrode E2-1 to the twentieth electrode E2-20 of the second group electrode E2.

The first line TL1-1 to the $n^{th}$ line TL1-$n$ of the first group line TL1 may be located as discussed below even if the letter n is not an integer multiple of the letter m, reduced interference may be provided between the first group line TL1 and the first and second group electrodes E1 and E2.

Some of the first line TL1-1 to the $n^{th}$ line TL1-$n$ of the first group line TL1 may be uniformly located on a first region of the first sensing region 200-SA1. The first region of the first sensing region 200-SA1 may be a zone where the first electrode E2-1 to the $(m-1)^{th}$ electrode E2-$(m-1)$ of the second group electrode E2 are located.

The first line TL1-1 to the $i^{th}$ line TL1-$i$ of the first group line TL1 respectively connected to the first electrode E1-1 to the $i^{th}$ electrode E1-$i$ of the first group electrode E1 may be uniformly located on a zone where the first electrode E2-1 to the $(m-1)^{th}$ electrode E2-$(m-1)$ of the second group electrode E2 are located.

For example, if the letter n is 43, the letter m is 20, and the letter i is 38, in the first region of the first sensing region 200-SA1, the first line TL1-1 to the thirty-eighth line TL1-38 of the first group line TL1 may be located such that two lines of the first group line TL1 may overlap on every sensing unit SU. In the first region of the first sensing region 200-SA1, k number of lines of the first group line TL1 may overlap on every electrode of the second group electrode E2 (or on every sensing unit SU). The letter k may be an integer that is equal to or greater than 1.

Remaining lines of the first line TL1-1 to the $n^{th}$ line TL1-$n$ of the first group line TL1 may be located on a second region of the first sensing region 200-SA1. The second region may be a zone other than the first region of the first sensing region 200-SA1. Among first line TL1-1 to the $n^{th}$ line TL1-$n$ of the first group line TL1, the $(i+1)^{th}$ line TL1-$(i+1)$ to the $n^{th}$ line TL1-$n$ may be located to correspond to the $m^{th}$ electrode E2-$m$ of the second group electrode E2. The first region of the first sensing region 200-SA1 may have an area that is greater than that of the second region of the first sensing region 200-SA1. In the first sensing region 200-SA1, a zone where the first group line TL1 is uniformly located may occupy an area that is greater than that of a zone where a density of the first group line TL1 is relatively large.

For example, if the letter n is 43, the letter m is 20, and the letter i is 38, the thirty-ninth line TL1-39 to the forty-third line TL1-43 of the first group line TL1 may be located to correspond to the $m^{th}$ electrode E2-$m$ of the second group electrode E2. The number of lines of the first group line TL1 that correspond to the $m^{th}$ electrode E2-$m$ may be greater than the number of lines that correspond to the $(m-1)^{th}$ electrode E2-$(m-1)$ and the number of each electrode located on the first region of the first sensing region 200-SA1.

For example, if the letter n is 32, the letter m is 10, and the letter i is 27, in the first region of the first sensing region 200-SA1, the first line TL1-1 to the twenty-seventh line TL1-27 of the first group line TL1 may correspond to the first electrode E2-1 to the ninth electrode E2-9 of the second group electrode E2, and in the first region of the first sensing region 200-SA1, three lines of the first group line TL1 may be located to overlap on every sensing unit SU. In the second region of the first sensing region 200-SA1, the twenty-eighth line TL1-28 to the thirty-second line TL1-32 of the first group line TL1 may be located to correspond to the tenth electrode E2-10 of the second group electrode E2. In the second region of the first sensing region 200-SA1, five lines of the first group line TL1 may be located to overlap on every sensing unit SU. For example, in the second region of the first sensing region 200-SA1, p number of lines of the first group line TL1 may overlap on every sensing unit SU, letter p being greater than the letter k.

The $(i+1)^{th}$ line TL1-$(i+1)$ to the $n^{th}$ line TL1-$n$ may have their lengths and resistances that are less than those of the $i^{th}$ line TL1-$i$. The lengths and resistances of the $(i+1)^{th}$ line TL1-$(i+1)$ to the $n^{th}$ line TL1-$n$ may decrease in a direction from the $(i+1)^{th}$ line TL1-$(i+1)$ toward the $n^{th}$ line TL1-$n$. On the sensing unit SU in the first region of the first sensing region 200-SA1, lines of the first group line TL1 may overlap the first group electrode E1, and might not overlap the second group electrode E2. Lines of the first group line TL1 may extend in the second direction DR2 through a zone where the first group electrode E1 is located, and this will be further discussed in detail below with reference to FIGS. 8A to 11B.

In one or more embodiments of the present disclosure, among the first line TL1-1 to the $n^{th}$ line TL1-$n$ of the first group line TL1, one or more (e.g., the first to $i^{th}$ trace lines TL1-1 to TL1-$i$) located on the first region of the first sensing region 200-SA1 may have the same length. In one or more embodiments of the present disclosure, the first points P1 where the first trace line TL1-1 (or the first line) to the $n^{th}$ trace line TL1-$n$ (or the $n^{th}$ line) are connected with the first electrode E1-1 to the $n^{th}$ electrode E1-$n$ may be arranged as shown in FIGS. 6 and 7. Distances between the first points P1 and the pads PD1 and PD2 of FIG. 6 may decrease in a direction from the first trace line TL1-1 (or the first line) toward the $n^{th}$ trace line TL1-$n$ (or the $n^{th}$ line).

Figure 8A:
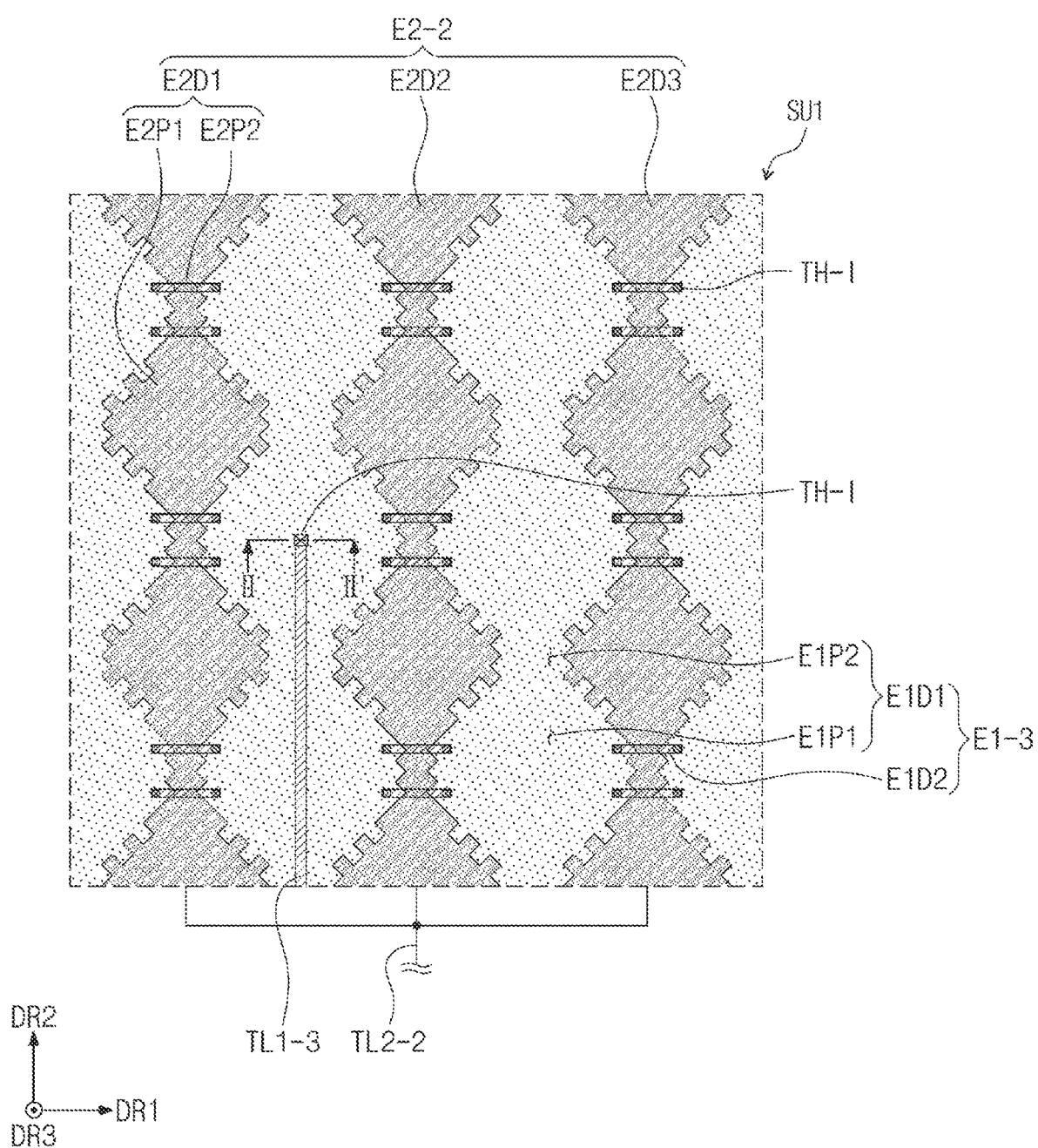
FIGS. 8A and 8B illustrate enlarged plan views showing first and second sensing units of FIG. 7.
Figure 8B:
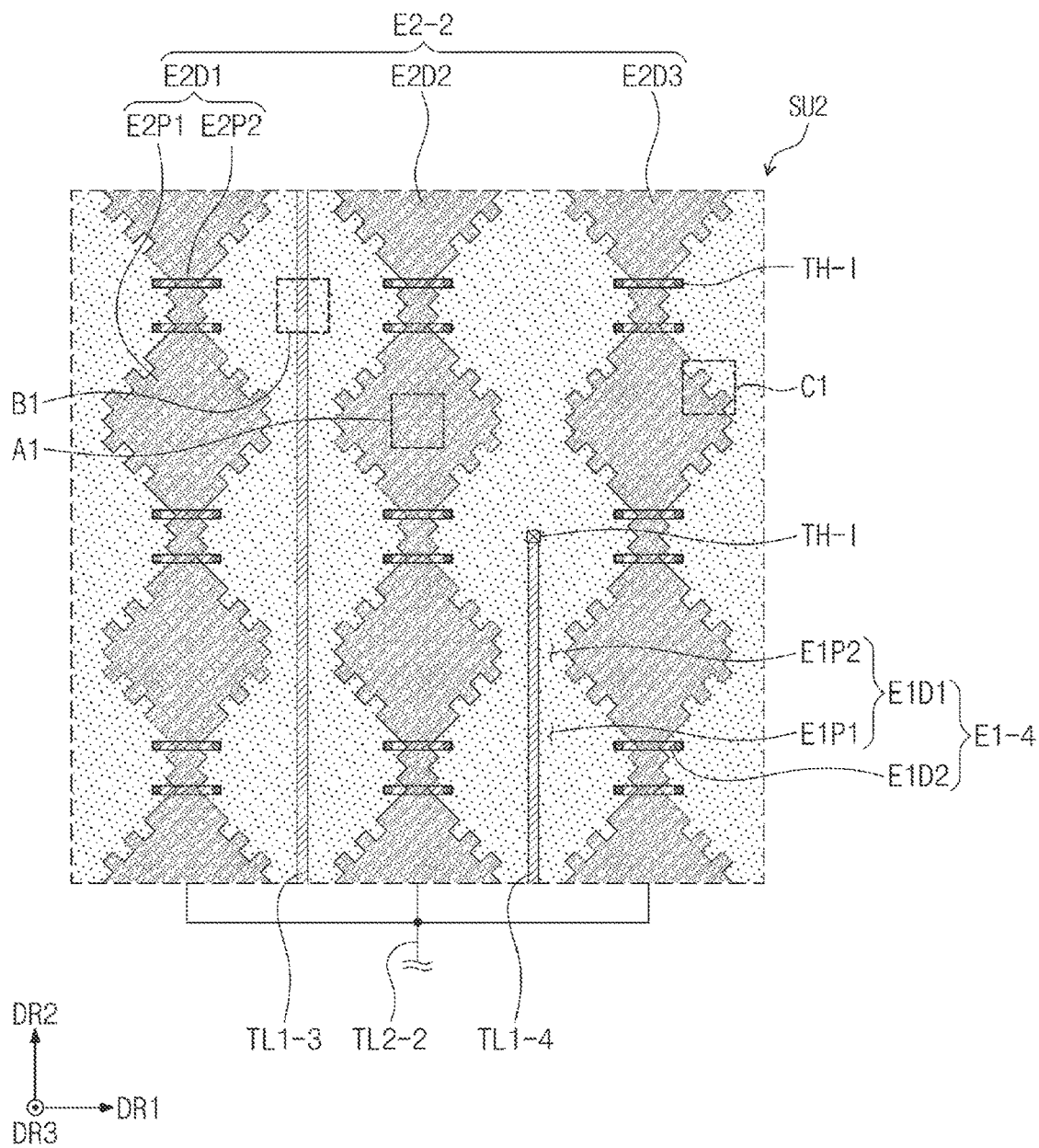
Figure 8C:
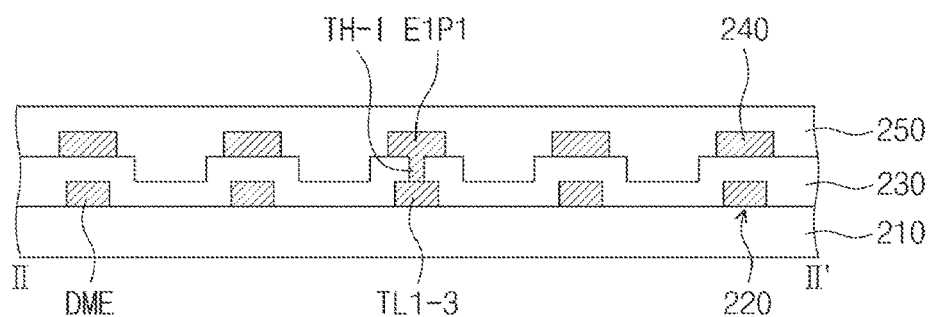
FIG. 8C illustrates a cross-sectional view showing an input sensor taken along the line II-II' of FIG. 8A.

FIGS. 8A and 8B respectively illustrate enlarged plan views showing first and second sensing units SU1 and SU2 of FIG. 7. FIG. 8C illustrates a cross-sectional view showing the input sensor 200 taken along the line II-II' of FIG. 8A.

FIGS. 8A and 8B respectively depict, among a plurality of sensing units SU of FIG. 7, a first sensing unit SU1 where the third electrode E1-3 of the first group electrode E1 intersects the second electrode E2-2 of the second group electrode E2, and a second sensing unit SU2 where the fourth electrode E1-4 of the first group electrode E1 intersects the second electrode E2-2 of the second group electrode E2.

In the first sensing unit SU1, the third line TL1-3 of the first group line TL1 may be connected to the third electrode E1-3 of the first group electrode E1. In the second sensing unit SU2, the fourth line TL1-4 of the first group line TL1 may be connected to the fourth electrode E1-4 of the first group electrode E1. Except that mentioned above, the first sensing unit SU1 and the second sensing unit SU2 may be substantially the same.

Referring to FIGS. 8A and 8B, the second electrode E2-2 of the second group electrode E2 may include a plurality of division electrodes E2D1, E2D2, and E2D3 that extend substantially in the second direction DR2, and are located spaced apart from each other in the first direction DR1 in the first sensing region (e.g., see the first sensing region 200-SA1 of FIG. 7) or related sensing units SU1 and SU2. Three division electrodes E2D1, E2D2, and E2D3 are illustrated by way of example. In the following description, in order to distinguish and explain the three division electrodes E2D1, E2D2, and E2D3, the three division electrodes E2D1, E2D2, and E2D3 may be defined into a first division electrode E2D1, a second division electrode E2D2, and a third division electrode E2D3.

Each of the division electrodes E2D1, E2D2, and E2D3 may include two parts whose shapes are different from each other. A sensing part E2P1 may be defined to indicate a part whose area is relatively large, and a middle part E2P2 may be defined to indicate a part whose area is relatively small. The sensing parts E2P1 and the middle parts E2P2 may be alternately located along the second direction DR2. The sensing parts E2P1 and the middle parts E2P2 may have a single unitary shape. The division electrodes E2D1, E2D2, and E2D3 may be formed from the second conductive layer 240 discussed with reference to FIG. 5.

The third electrode E1-3 of the first group electrode E1 and the fourth electrode E1-4 of the first group electrode E1 may each include sensing patterns E1D1 and bridge patterns E1D2 located on a layer different from that of the sensing patterns E1D1. The sensing patterns E1D1 may be spaced apart from each other along the first direction DR1, and may be located between the division electrodes E2D1, E2D2, and E2D3. Each of the sensing patterns E1D1 may include two parts whose shapes are different from each other. A sensing part E1P1 may be defined to indicate a part whose area is relatively large, and a middle part E1P2 may be defined to indicate a part whose area is relatively small. The sensing patterns E1D1 are illustrated, and include three sensing parts E1P1 and two middle parts E1P2 are shown. The sensing parts E1P1 and the middle parts E1P2 may be alternately located along the second direction DR2. The sensing parts E1P1 and the middle parts E1P2 may have a single unitary shape. The sensing parts E1P1 of the sensing patterns E1D1 may be located between respective middle parts E2P2 of the division electrodes E2D1, E2D2, and E2D3.

FIG. 8A depicts only a portion of the third electrode E1-3 of the first group electrode E1 that corresponds to the first sensing unit SU1, but referring to FIG. 7, the third electrode E1-3 of the first group electrode E1 may include the sensing patterns E1D1 that correspond to a plurality of sensing units SU that are arranged along the first direction DR1.

Referring to FIGS. 7, 8A, and 8B, the sensing patterns E1D1 of the first sensing unit SU1 and adjacent sensing patterns E1D1 of the second sensing unit SU2 may be spaced apart from each other in the second direction DR2. Six bridge patterns E1D2 are illustrated, and connect two sensing patterns E1D1 that are located adjacent to each other in the first direction DR1. The number and shape of the bridge patterns E1D2 are not particularly limited thereto.

Referring to FIGS. 8A and 8B, the third line TL1-3 of the first group line TL1 may be located between the first division electrode E2D1 and the second division electrode E2D2 included in the second electrode E2-2 of the second group electrode E2, and the fourth line TL1-4 of the first group line TL1 may be located between the second division electrode E2D2 and the third division electrode E2D3 included in the second electrode E2-2 of the second group electrode E2.

When viewed in plan, the third line TL1-3 of the first group line TL1 may overlap at least one of the sensing patterns E1D1 included in the third electrode E1-3 of the first group electrode E1, and might not overlap the second electrode E2-2 of the second group electrode E2. The fourth line TL1-4 of the first group line TL1 may overlap at least one of the sensing patterns E1D1 included in the fourth electrode E1-4 of the first group electrode E1, and might not overlap the second electrode E2-2 of the second group electrode E2. Therefore, the second group electrode E2 and the first group line TL1 may have therebetween minimum signal interference or parasitic capacitance.

Referring to FIGS. 8A and 8B, the third line TL1-3 of the first group line TL1 may be connected to an overlapping one of the sensing patterns E1D1 included in the third electrode E1-3 of the first group electrode E1. The fourth line TL1-4 of the first group line TL1 may be connected to an overlapping one of the sensing patterns E1D1 included in the fourth electrode E1-4 of the first group electrode E1. Referring to FIG. 8C, the third line TL1-3 of the first group line TL1 may be connected to corresponding sensing patterns E1D1 through a contact hole TH-I that penetrates the second insulation layer 230. The third insulation layer 250 may cover the sensing patterns E1D1. The sensing pattern E1D1 and the bridge pattern E1D2 of FIGS. 8A and 8B may also be connected through a contact hole that penetrates the second insulation layer 230, like the contact hole TH-I of FIG. 8C. As illustrated in FIG. 8C, a dummy electrode DME may be located on the same layer as that of the second group line TL2, and the dummy electrode DME will be discussed below with reference to FIGS. 10A and 10B.

Figure 9A:
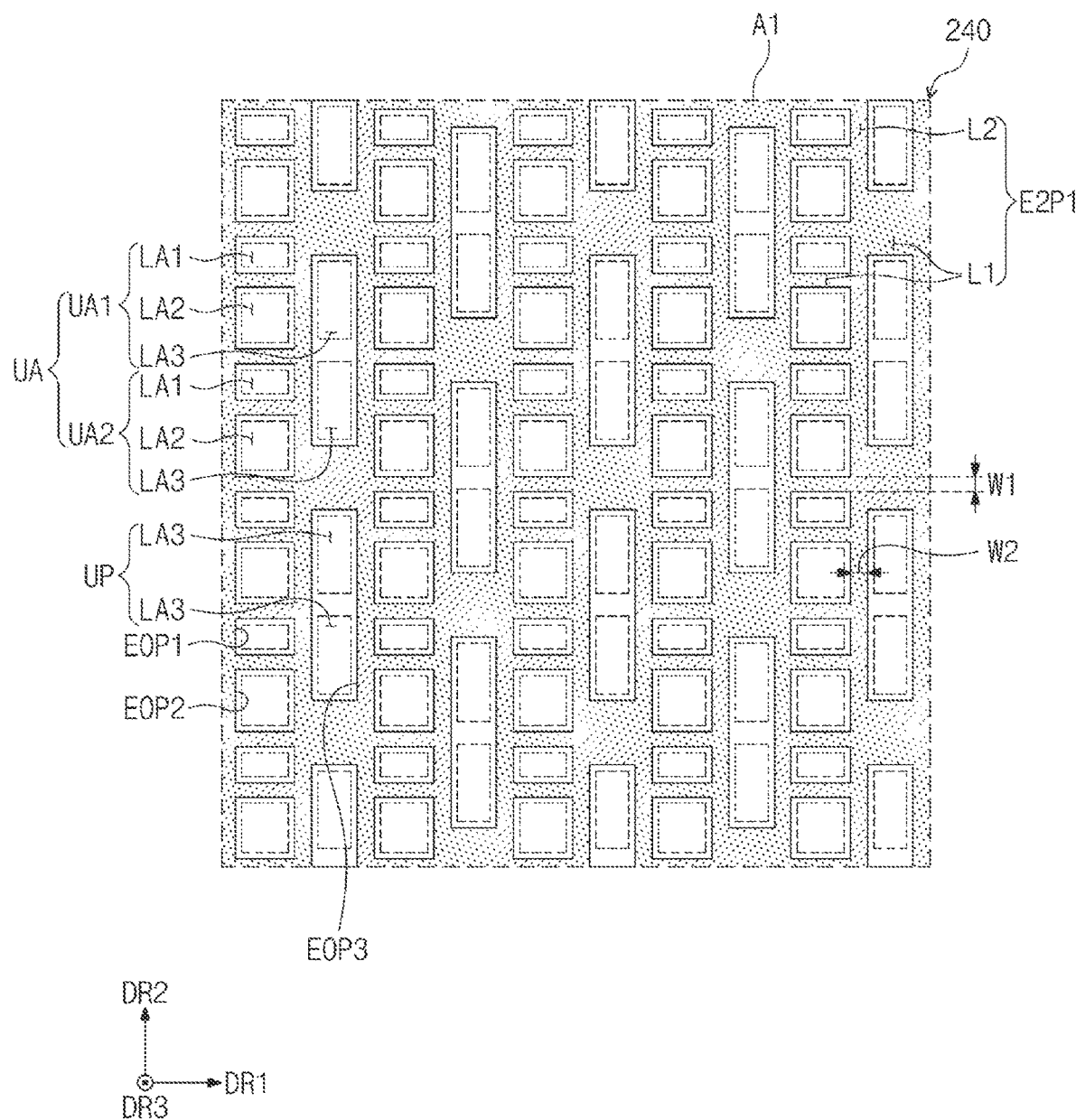
FIG. 9A illustrates an enlarged plan view showing a second conductive layer that corresponds to a first region of FIG. 8B.
Figure 9B:
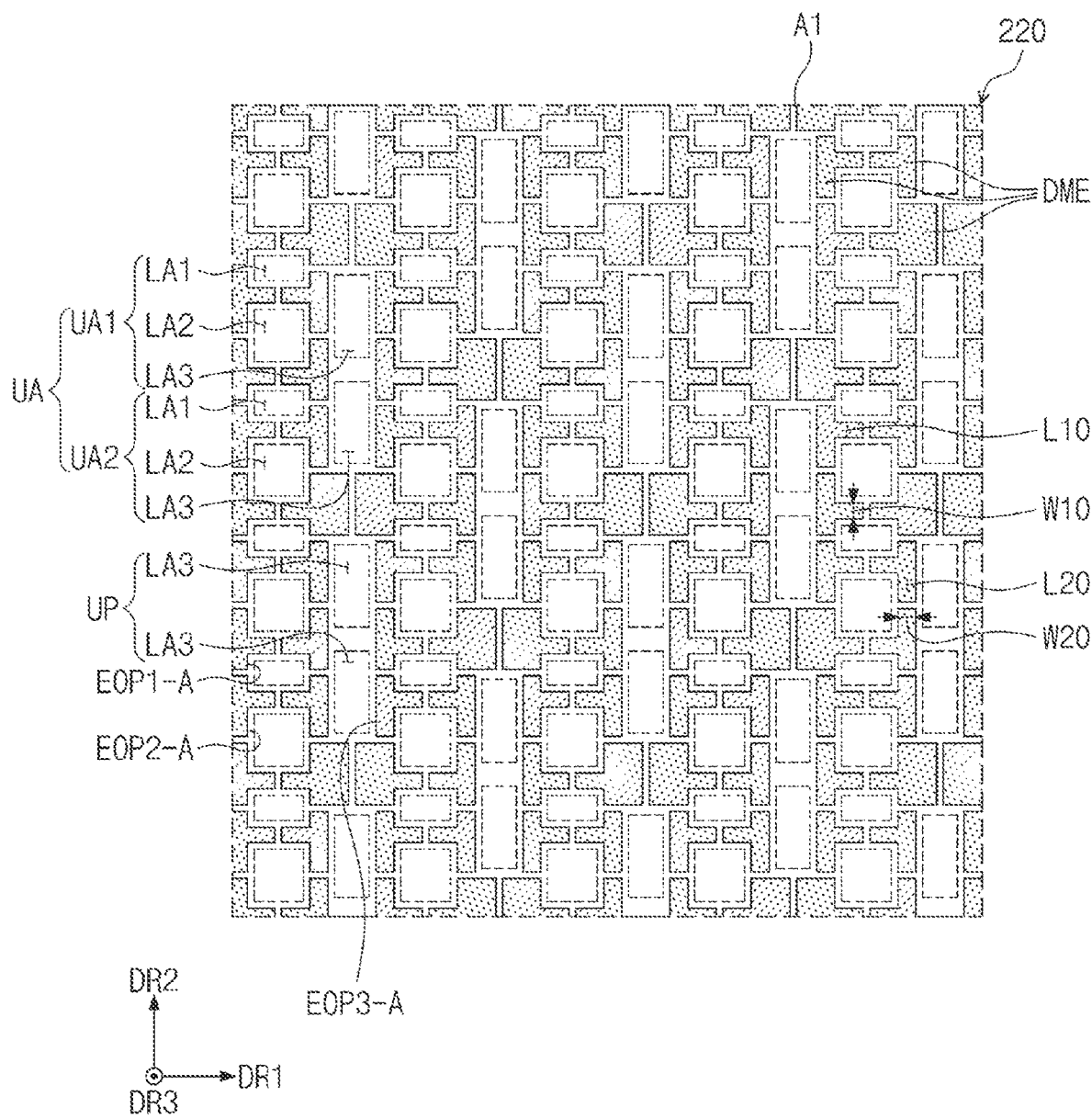
FIG. 9B illustrates an enlarged plan view showing a first conductive layer that corresponds to a first region of FIG. 8B.
Figure 10A:
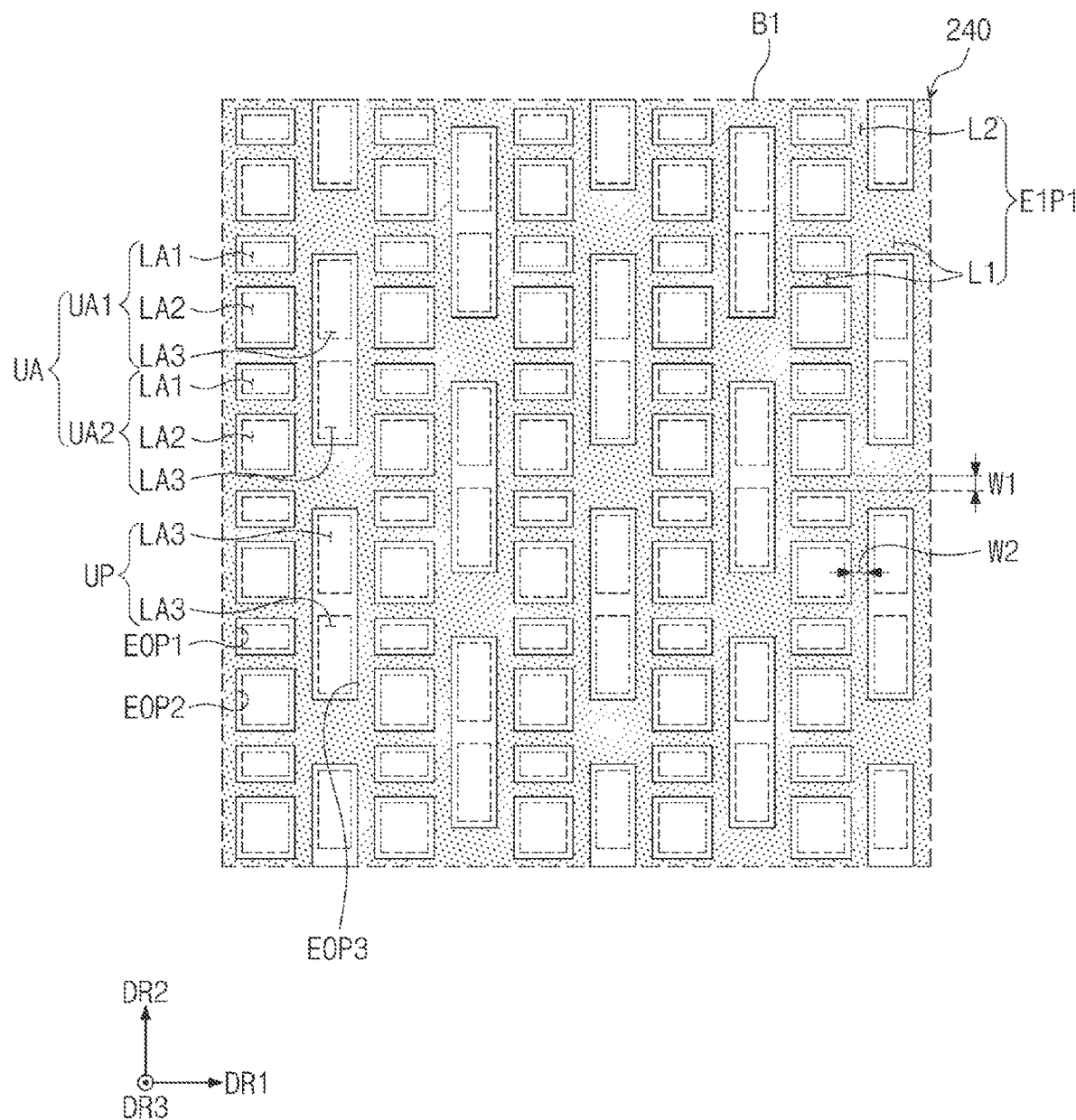
FIG. 10A illustrates an enlarged plan view showing a second conductive layer that corresponds to a second region of FIG. 8B.
Figure 10B:
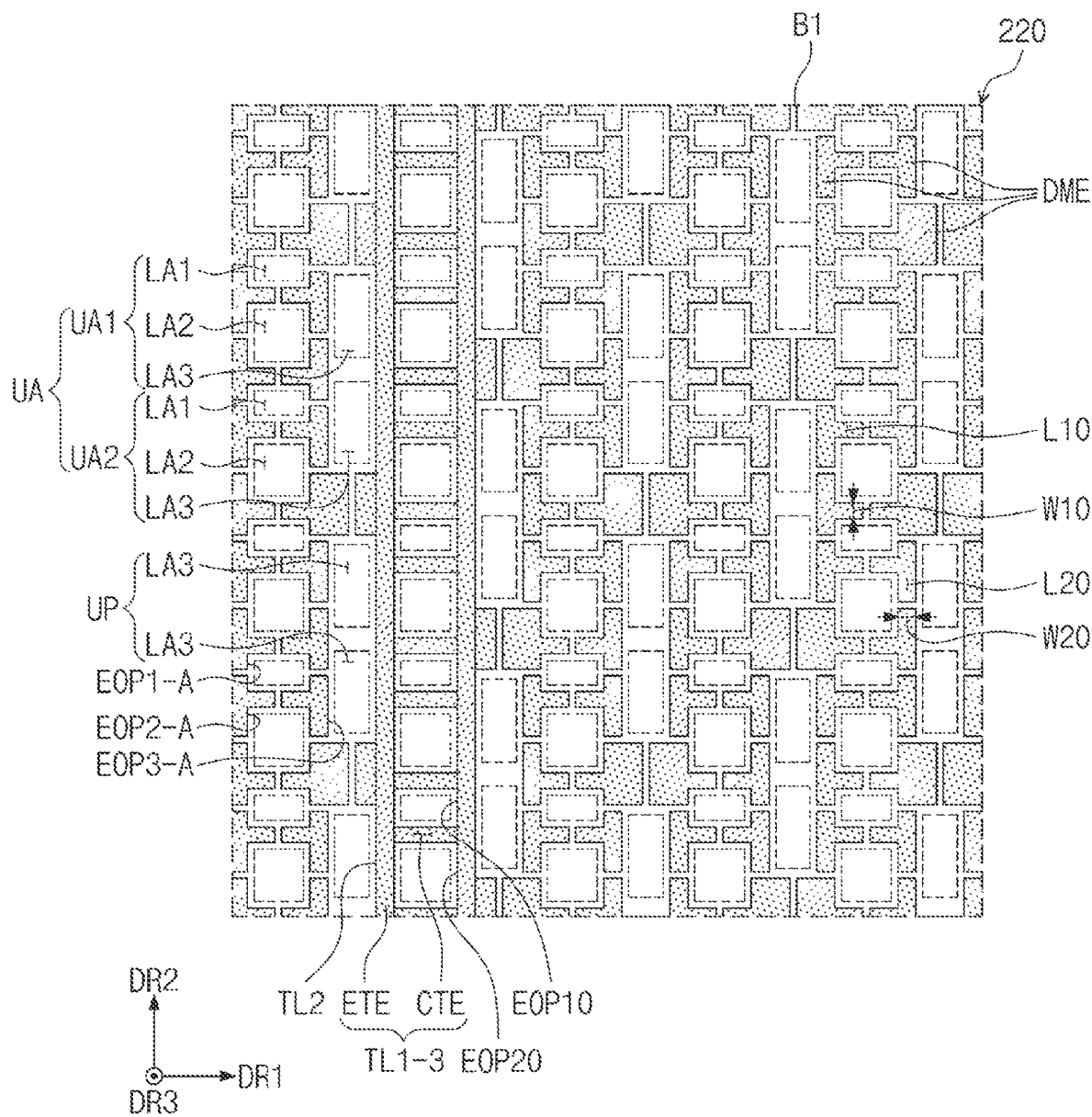
FIG. 10B illustrates an enlarged plan view showing a first conductive layer that corresponds to a second region of FIG. 8B.
Figure 11A:
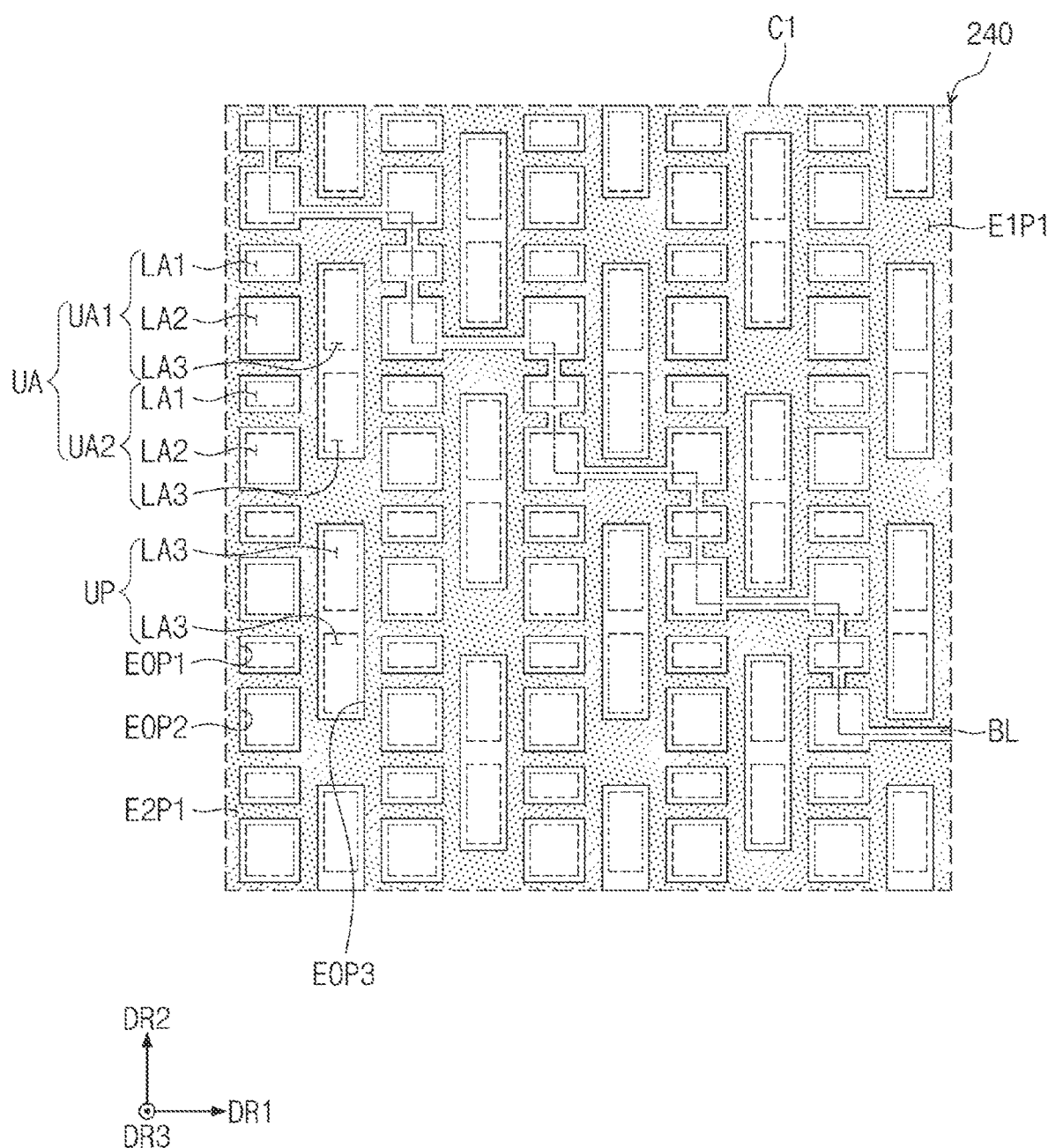
FIG. 11A illustrates an enlarged plan view showing a second conductive layer that corresponds to a third region of FIG. 8B.
Figure 11B:
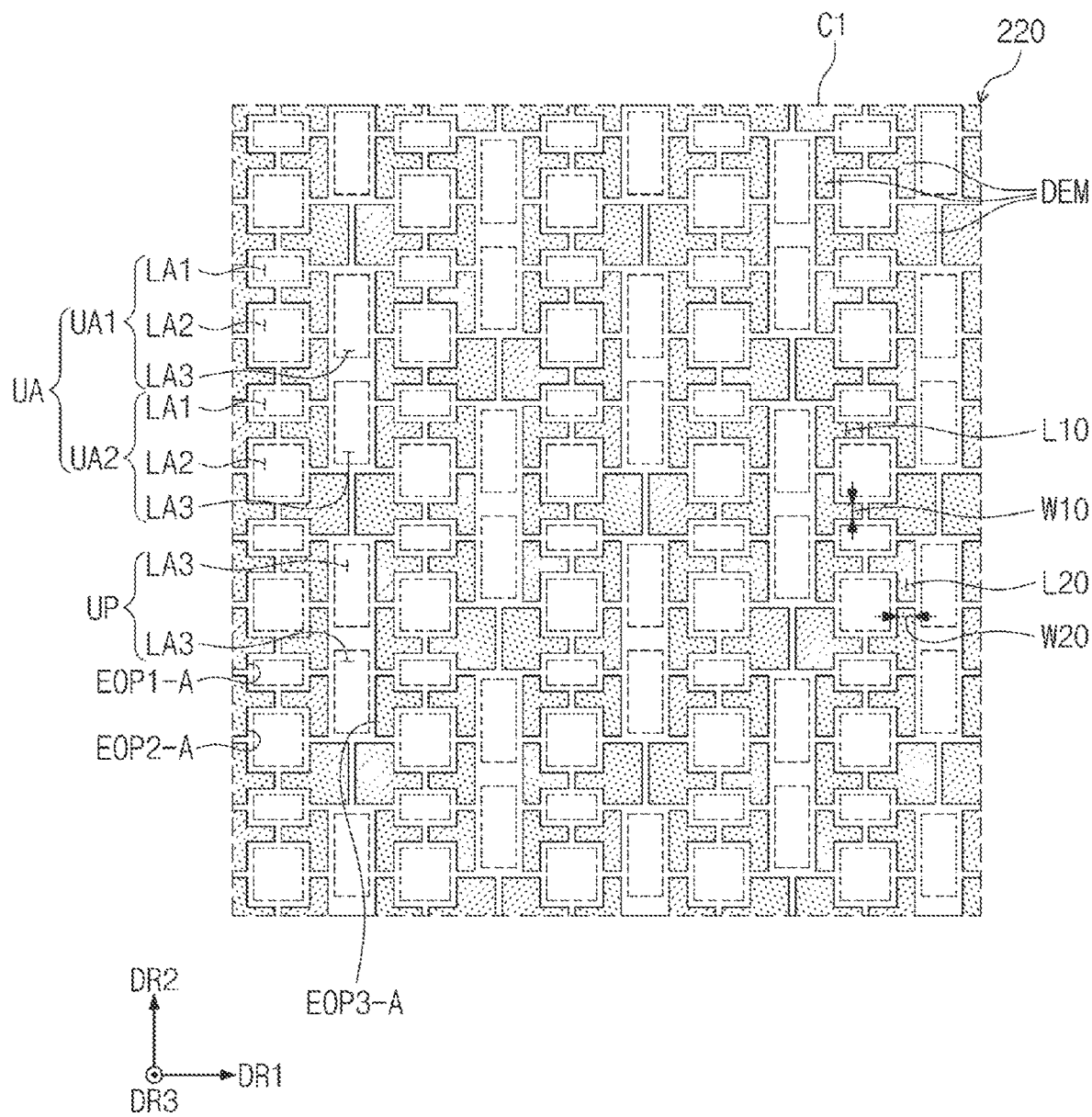
FIG. 11B illustrates an enlarged plan view showing a first conductive layer that corresponds to a third region of FIG. 8B.

FIG. 9A illustrates an enlarged plan view showing the second conductive layer 240 that corresponds to a first region A1 of FIG. 8B. FIG. 9B illustrates an enlarged plan view showing the first conductive layer 220 that corresponds to the first region A1 of FIG. 8B. FIG. 10A illustrates an enlarged plan view showing the second conductive layer 240 that corresponds to a second region B1 of FIG. 8B. FIG. 10B illustrates an enlarged plan view showing the first conductive layer 220 that corresponds to the second region B1 of FIG. 8B. FIG. 11A illustrates an enlarged plan view showing the second conductive layer 240 that corresponds to a third region C1 of FIG. 8B. FIG. 11B illustrates an enlarged plan view showing the first conductive layer 220 that corresponds to the third region C1 of FIG. 8B.

In FIGS. 9A to 11B, the second conductive layer 240 may mean the second conductive layer 240 of FIG. 5, and the first conductive layer 220 may mean the first conductive layer 220 of FIG. 5. FIG. 9A shows an enlarged illustration of the sensing part E2P1 formed from the second conductive layer 240. The sensing part E2P1 is illustrated as a representative of the second group electrode E2. FIGS. 9A to 11B also depict the display region 100-DA illustrated in FIG. 4A.

Referring to FIGS. 8B and 9A, a plurality of openings EOP1, EOP2, and EOP3 may be defined on the sensing part E2P1 included in the second electrode E2-2 of the second group electrode E2. The plurality of openings EOP1, EOP2, and EOP3 may include a first opening EOP1 that corresponds to the first emission region LA1, a second opening EOP2 that corresponds to the second emission region LA2, and a third opening EOP3 that corresponds to the emission region pair UP. The first emission region LA1 may be located inside the first opening EOP1, the second emission region LA2 may be located inside the second opening EOP2, and the emission region pair UP may be located inside the third opening EOP3. The third opening EOP3 may be provided therein in common with the respective third emission regions LA3 of the first and second unit emission regions UA1 and UA2 illustrated in FIG. 4A. In one or more embodiments of the present disclosure, the third opening EOP3 may be formed on every one of the third emission regions LA3 of the first and second unit emission regions UA1 and UA2.

The sensing part E2P1 may include a plurality of line segments L1 and L2 that define the plurality of openings EOP1, EOP2, and EOP3. The plurality of lines L1 and L2 may include first line segments L1 that extend in the first direction DR1, and second line segments L2 that extend in the second direction DR2. Each of the first line segments L1 may extend from one second line segment L2 toward another second line segment L2 adjacent to the one second line segment L2. The first line segments L1 may be located between two neighboring ones in the second direction DR2 of the plurality of openings EOP1, EOP2, and EOP3, and may include a plurality of line segment groups that are distinguished based on width in the second direction DR2.

Referring to FIG. 9B, a plurality of dummy electrodes DME may be located on a zone that overlaps the sensing part E2P1 shown in FIG. 9A. The plurality of dummy electrodes DME may have an arrangement by which the sensing part E2P1 shown in FIG. 9A is cut (or divided) in accordance with a corresponding rule or scheme. As the plurality of dummy electrodes DME are located to substantially completely overlap the sensing part E2P1, a step difference may be reduced or prevented from occurring due to the first conductive layer (e.g., first conductive layer 220 of FIG. 5).

Four dummy electrodes DME may be located around a first area EOP1-A. The first area EOP1-A may correspond to the first opening EOP1. Two cutting regions (or division regions) may be located to face each in the second direction DR2 across the first area EOP1-A, and two cutting regions may be located to face each other in the first direction DR1 across the first area EOP1-A. Four dummy electrodes DME may be located around a second area EOP2-A that corresponds to the second opening EOP2. Two cutting regions may be located to face each in the second direction DR2 across the second area EOP2-A, and two cutting regions may be located to face each other in the first direction DR1 across the second area EOP2-A. Two cutting regions may be located to face each in the second direction DR2 across a third area EOP3-A, and two cutting regions may be located to face each other in the first direction DR1 across the third area EOP3-A. However, the aforementioned arrangement of the cutting regions is merely example, and shapes and arrangement of the dummy electrodes DME are not limited thereto.

Referring to FIGS. 9A and 9B, the sensing part E2P1 may have a width that is greater than that of the dummy electrode DME. The first line segment L1 of the sensing part E2P1 may have a width W1 that is greater than a width W10 of a cut first line segment L10 of the dummy electrode DME, and the second line segment L2 of the sensing part E2P1 may have a width W2 that is greater than a width W20 of a cut second line segment L20 of the dummy electrode DME. Therefore, the sensing part E2P1 may cover the dummy electrode DME. In FIGS. 9A and 9B, the first line segment L1 of the sensing part E2P1, and the first line segment L10 of the dummy electrode DME, are compared with each other in terms of width. In FIG. 8C, the sensing part E1P1 of the first group electrode E1 and the dummy electrode DME may be compared with each other in terms of width.

Referring to FIGS. 8B and 10A, the sensing part E1P1 included in the fourth electrode E1-4 of the first group electrode E1 may be substantially the same as the sensing part E2P1 included in the second electrode E2-2 of the second group electrode E2 depicted in FIGS. 8B and 9A. Referring to FIG. 10B, the third line TL1-3 of the first group line TL1 and a plurality of dummy electrodes DME may be located on a zone that overlaps the sensing part E1P1 of FIG. 10A. The third line TL1-3 of the first group line TL1 may include extension line segments ETE that extend in the second direction DR2, and may also include connection line segments CTE located between the extension line segments ETE. The third line TL1-3 of the first group line TL1 is illustrated to include two extension line segments ETE.

The third line TL1-3 of the first group line TL1 may include a first opening EOP10 that is defined to correspond to the first opening EOP1 of FIG. 10A, and a second opening EOP20 that is defined to correspond to the second opening EOP2 of FIG. 10A. A plurality of dummy electrodes DME may be located on a zone other than that where the third line TL1-3 of the first group line TL1 is located. In comparison with FIG. 9B, some of the plurality of dummy electrodes DME may be connected to each other to define the third line TL1-3 of the first group line TL1.

Referring to FIGS. 8B and 11A, a boundary line BL may be provided between the sensing part E1P1, which is included in the fourth electrode E1-4 of the first group electrode E1, and the sensing part E2P1 included in the second electrode E2-2 of the second group electrode E2. A conductive pattern of the second conductive layer 240 shown in FIG. 9A may be cut in accordance with a certain rule, such that a boundary area may be defined between the sensing part E1P1 included in the fourth electrode E1-4 of the first group electrode E1 and the sensing part E2P1 included in the second electrode E2-2 of the second group electrode E2.

Referring to FIG. 11B, a plurality of dummy electrodes DME may be located in accordance with a certain rule, irrespective of the sensing part E1P1 included in the fourth electrode E1-4 of the first group electrode E1 and the sensing part E2P1 included in the second electrode E2-2 of the second group electrode E2. The plurality of dummy electrodes DME may be located in accordance with the same rule as that discussed with reference to FIG. 9B.

Figure 12A:
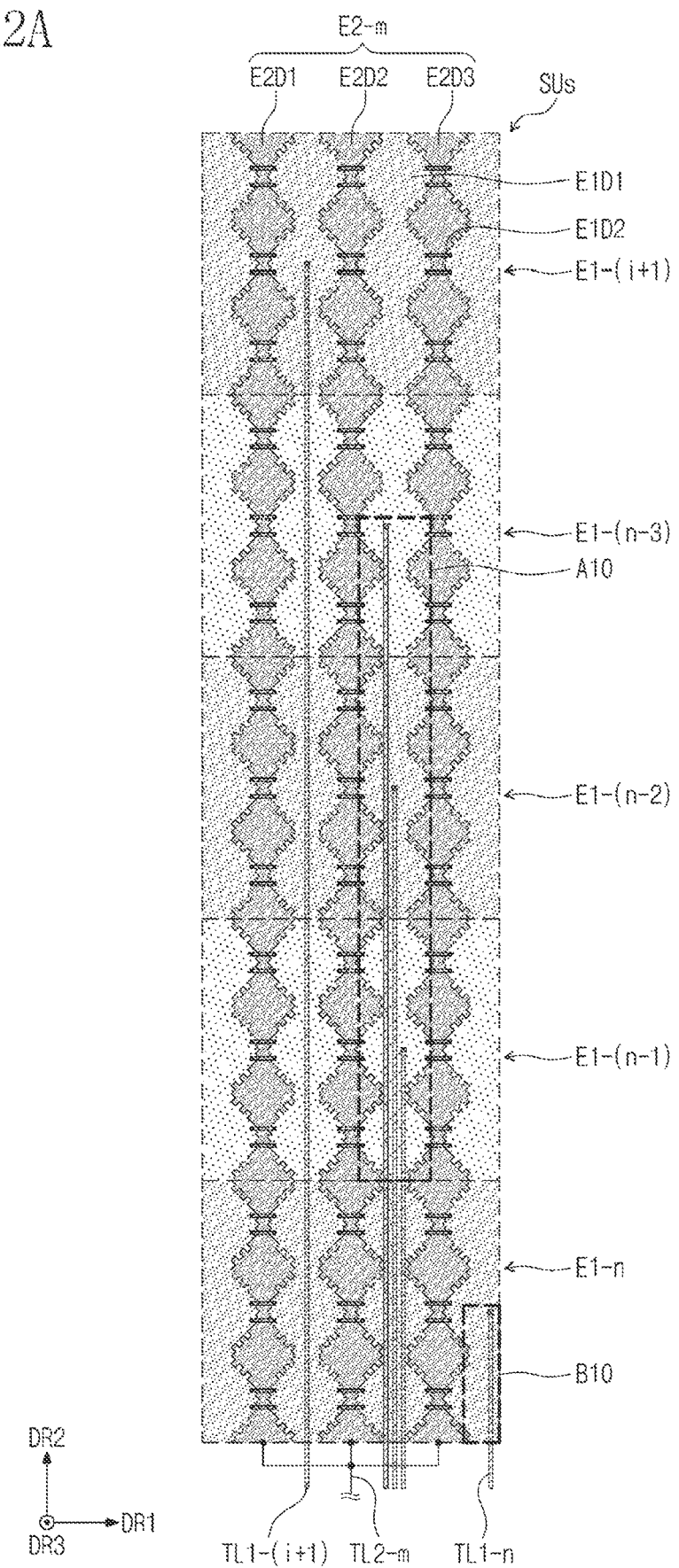
FIG. 12A illustrates an enlarged plan view showing a plurality of sensing units of FIG. 7.
Figure 12B:
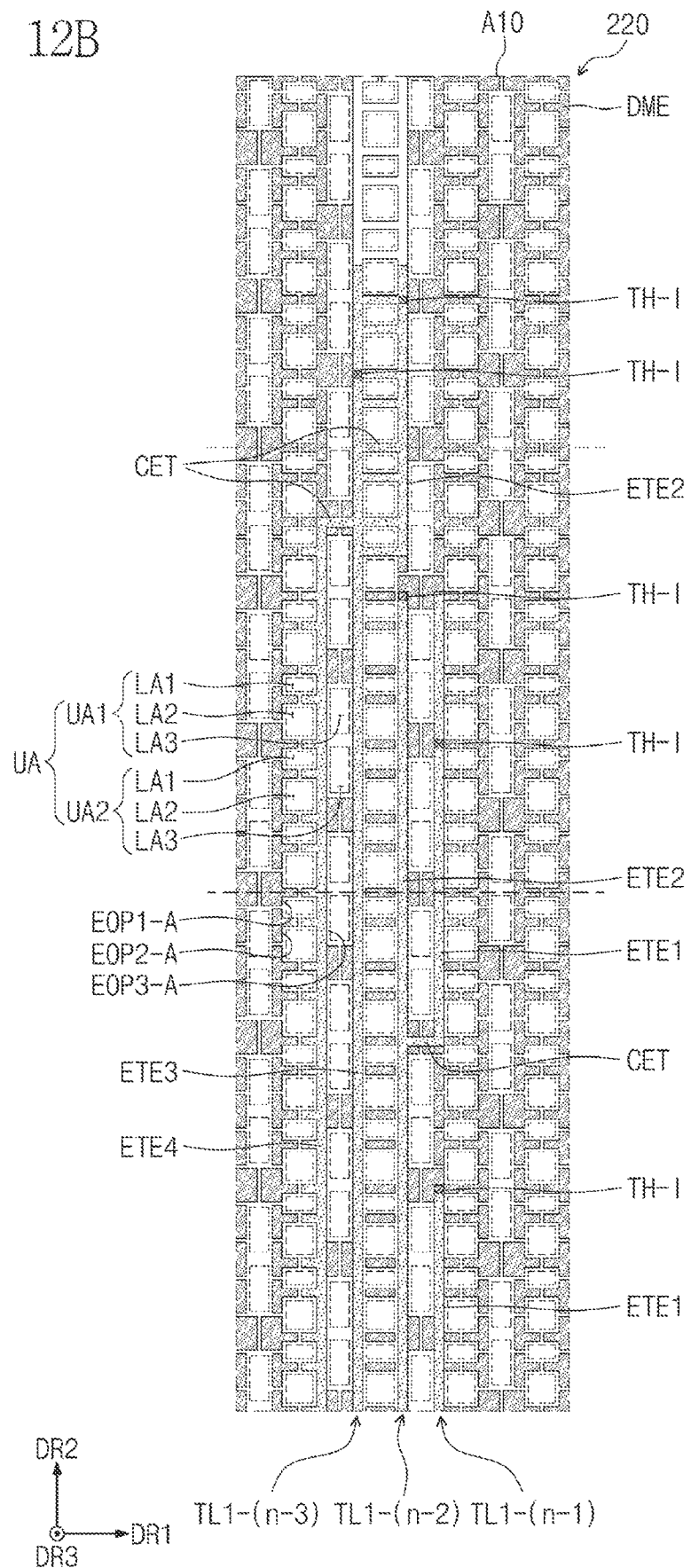
FIG. 12B illustrates an enlarged plan view showing a first conductive layer that corresponds to a first region of FIG. 12A.
Figure 12C:
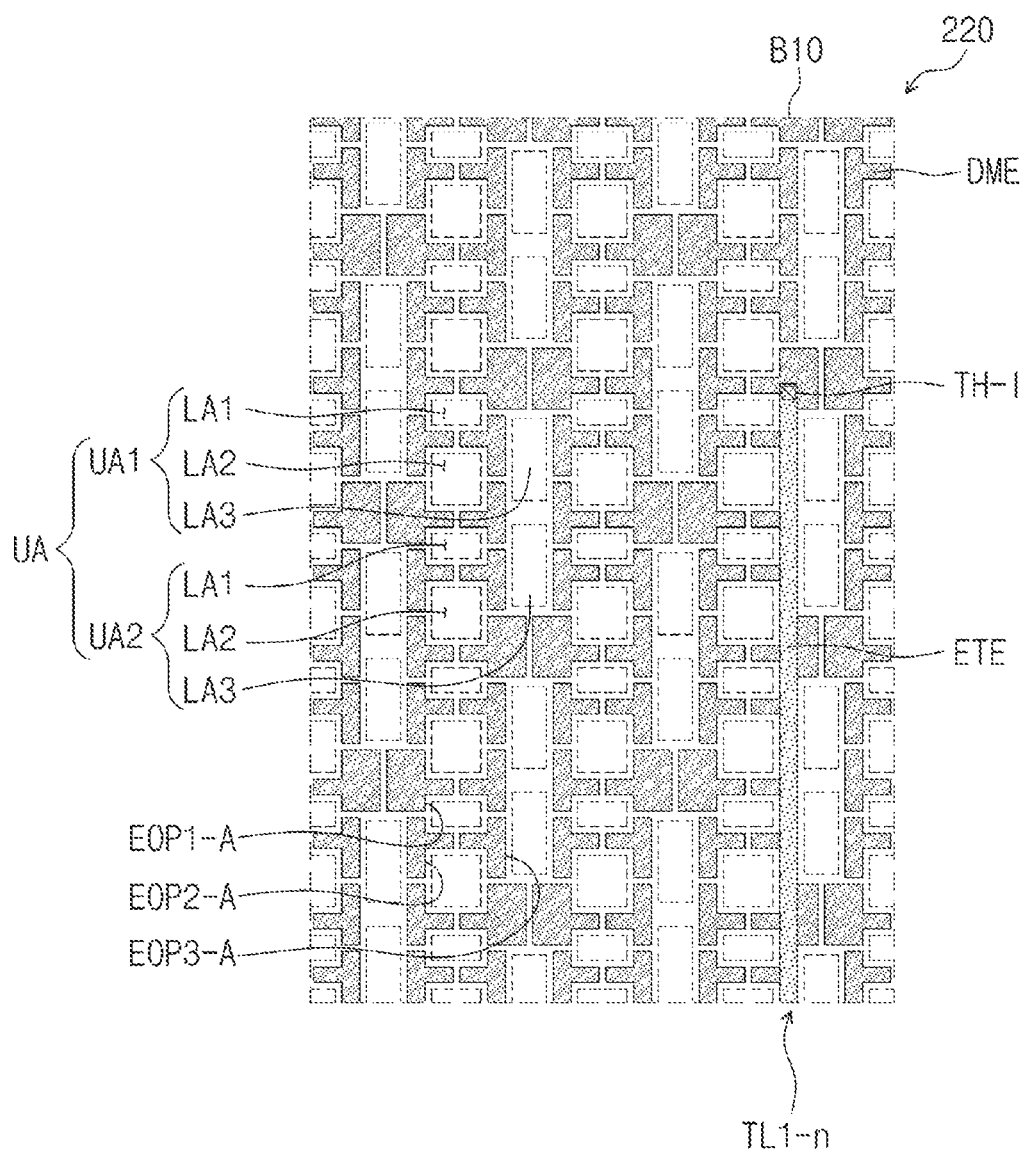
FIG. 12C illustrates an enlarged plan view showing a first conductive layer that corresponds to a second region of FIG. 12A.

FIG. 12A illustrates an enlarged plan view showing a plurality of sensing units SUs of FIG. 7. FIG. 12B illustrates an enlarged plan view showing the first conductive layer 220 that corresponds to a first region A10 of FIG. 12A. FIG. 12C illustrates an enlarged plan view showing the first conductive layer 220 that corresponds to a second region B10 of FIG. 12A. In the embodiments that follow, the description of FIGS. 7 to 11B will be true of components the same as those discussed with reference to FIGS. 7 to 11B.

FIG. 12A depicts five sensing units SUs defined by the $m^{th}$ electrode E2-$m$ of the second group electrode E2, and the $(i+1)^{th}$ electrode E1-$(i+1)$ to the $n^{th}$ electrode E1-$n$ of the first group electrode E1. The $(i+1)^{th}$ line TL1-$(i+1)$ to the $n^{th}$ trace line TL1-$n$ of the first group line TL1 may be correspondingly connected to the $(i+1)^{th}$ electrode E1-$(i+1)$ to the $n^{th}$ electrode E1-$n$ of the first group electrode E1.

The $(i+1)^{th}$ line TL1-$(i+1)$ of the first group line TL1 may be located between the first division electrode E2D1 and the second division electrode E2D2, the $n^{th}$ line TL1-$n$ of the first group line TL1 may be located on a right side of the second division electrode E2D2, and remaining trace lines of the first group line TL1 may be located between the second division electrode E2D2 and the third division electrode E2D3. In one or more embodiments of the present disclosure, two trace lines may be located between the first division electrode E2D1 and the second division electrode E2D2, and two trace lines may be located between the second division electrode E2D2 and the third division electrode E2D3.

A plurality of sensing units SUs may have a structure substantially the same as that of the second conductive layer 240 of the second sensing unit SU2 discussed with reference to FIGS. 9A, 10A, and 11A.

Referring to the first region A10 of FIG. 12B, the $(n-3)^{th}$ line TL1-$(n-3)$ to the $(n-1)^{th}$ line TL1-$(n-1)$ of the first group line TL1 may each include at least one of extension line segments ETE1, ETE2, ETE3, and ETE4 that extend in the second direction DR2. In the following description, the extension line segments ETE1, ETE2, ETE3, and ETE4 will be differently named to distinguish from each other.

The $(n-1)^{th}$ line TL1-$(n-1)$ may include a first extension line segment ETE1 that extends in the second direction DR2. The first extension line segment ETE1 may be connected through the contact hole TH-I to the (n−1)$^{th}$ electrode E1-(n−1) of the first group electrode E1 depicted in FIG. 12A. The (n−2)$^{th}$ line TL1-(n−2), which is spaced farther away than the (n−1)$^{th}$ line TL1-(n−1) from the n$^{th}$ line TL1-n of FIG. 12A, may include a 1-1$^{st}$ extension line segment ETE1 located on the same line of the first extension line segment ETE1, and spaced apart in the second direction DR2 from the first extension line segment ETE1.

The (n−2)$^{th}$ line TL1-(n−2) may include the 1-1$^{st}$ extension line segment ETE1, and a second extension line segment ETE2 spaced apart in the first direction DR1 from the 1-1$^{st}$ extension line segment ETE1. The (n−2)$^{th}$ line TL1-(n−2)$^{th}$ may further include a connection line segment CTE that connects the 1-1$^{st}$ extension line segment ETE1 to the second extension line segment ETE2. Each of the 1-1$^{st}$ extension line segment ETE1 and the second extension line segment ETE2 may be connected through the contact hole TH-I to the (n−2)$^{th}$ electrode E1-(n−2) of the first group electrode E1 depicted in FIG. 12A.

The (n−3)$^{th}$ line TL1-(n−3) may include a 2-1$^{st}$ extension line segment ETE2 located on the same line of the second extension line segment ETE2, and spaced apart in the second direction DR2 from the second extension line segment ETE2. The (n−3)$^{th}$ line TL1-(n−3) may include a third extension line segment ETE3 spaced apart in the first direction DR1 from the second extension line segment ETE2 of the (n−2)$^{th}$ line TL1-(n−2) and the 2-1$^{st}$ extension line segment ETE2 of the (n−3)$^{th}$ line TL1-(n−3). The (n−3)$^{th}$ line TL1-(n−3) may further include a connection line segment CTE that connects the 2-1$^{st}$ extension line segment ETE2 to the third extension line segment ETE3. The (n−3)$^{th}$ line TL1-(n−3) may further include a fourth extension line segment ETE4 spaced apart in the first direction DR1 from the third extension line segment ETE3. The connection line segment CTE may connect the third extension line segment ETE3 to the fourth extension line segment ETE4. The connection line segment CTE may be provided in plural.

As shown in FIG. 12C, the n$^{th}$ line TL1-n may include an extension line segment ETE that extends in the second direction DR2. The extension line segment ETE may be connected through the contact hole TH-I to the n$^{th}$ electrode E1-n of the first group electrode E1 depicted in FIG. 12A.

Referring to FIGS. 12A to 12C, the (i+1)$^{th}$ line TL1-(i+1) to the n$^{th}$ line TL1-n of the first group line TL1 may be relatively short and densely located, and this may have an additional effect on only some electrodes E1-(n−2), E1-(n−1), and E1-n of the first group electrode E1 and on the m$^{th}$ electrode E2-m of the second group electrode E2.

According to the present disclosure, an input sensor capable of independently operating may be located on every one of sensing units, and thus a sensing electrode may decrease in resistance. Therefore, it may be possible to reduce a load of the input sensor equipped in a relatively large-sized display device.

According to the present disclosure, a first group line may overlap a sensing region and a display region. The number of trace lines located on a non-display region may be decreased to reduce an area of the non-display region and the non-display region.

Although the number of a first group electrode and the number of a second group electrode are not an integer multiple of each other, most of trace lines of the first group line may be uniformly located on every second group electrode. The greater number of trace lines of the first group line may be located to correspond to a certain electrode of the second group electrode. As low resistance and small length trace lines are located to correspond to a certain electrode of the second group electrode, it may be possible to reduce an effect of densely located trace lines on the first group electrode and the second group electrode.

Although the embodiments have been described with reference to a number of illustrative examples thereof, it will be understood by those of ordinary skill in the art that various changes in form and details may be made without departing from the spirit and scope of the present disclosure as set forth in the following claims. Thus, the technical scope of the present disclosure is not limited by the embodiments and examples described above, but by the following claims, with functional equivalents thereof to be included therein.

What is claimed is:

1. A display device comprising an input sensor, the input sensor comprising:
 a first input sensor that overlaps a first sensing region, and that comprises:
  an insulation layer;
  a first group electrode extending in a first direction, and comprising a first electrode to an nth electrode that are arranged in a second direction crossing the first direction;
  a second group electrode crossing the first group electrode, and comprising a first electrode to an mth electrode;
  a first group line comprising a first trace line to an nth trace line that are respectively electrically connected to the first electrode to the nth electrode of the first group electrode; and
  a second group line comprising a first trace line to an mth trace line that are respectively electrically connected to the first electrode to the mth electrode of the second group electrode; and
 a second input sensor that overlaps a second sensing region that is different from the first sensing region,
 wherein n and m are natural numbers equal to or greater than 2, n being greater than m and not being an integer multiple of the m,
 wherein the first trace line to the n$^{th}$ trace line of the first group line overlap the first sensing region,
 wherein the first trace line to an i$^{th}$ trace line among the first to n$^{th}$ trace lines of the first group line are uniformly located to correspond to the first electrode to an (m−1)$^{th}$ electrode of the second group electrode, i being a natural number equal to or greater than 2,
 wherein an (i+1)$^{th}$ trace line to the n$^{th}$ trace line among the first to n$^{th}$ trace lines of the first group line are located to correspond to the m$^{th}$ electrode of the second group electrode, and
 wherein a number of the (i+1)$^{th}$ to the nth trace lines is greater than a number of trace lines of the first group line that correspond to the (m−1)th electrode of the second group electrode, such that a spacing between adjacent ones of the (i+1)th to the nth trace lines is different than a spacing between adjacent ones of the trace lines of the first group line that correspond to the (m−1)th electrode of the second group electrode.

2. The display device of claim 1, wherein respective lengths of the (i+1)$^{th}$ to the n$^{th}$ trace lines decrease from the (i+1)$^{th}$ trace line toward the n$^{th}$ trace line.

3. The display device of claim 1, wherein respective resistances of the (i+1)$^{th}$ to the n$^{th}$ trace lines decrease from the (i+1)$^{th}$ trace line toward the n$^{th}$ trace line.

4. The display device of claim 1, wherein one trace line among the (i+1)$^{th}$ to the n$^{th}$ trace lines comprises a first extension line segment, and wherein another trace line among the $(i+1)^{th}$ to the $n^{th}$ trace lines adjacent to the one trace line comprises a $1\text{-}1^{st}$ extension line segment on a same line as, and spaced apart in the second direction from, the first extension line segment, and is closer to the $n^{th}$ trace line than the one trace line.

5. The display device of claim 4, wherein the one trace line further comprises a second extension line segment spaced apart in the first direction from the first extension line segment and the $1\text{-}1^{st}$ extension line segment.

6. The display device of claim 5, wherein the one trace line further comprises a third extension line segment that is spaced apart in the first direction from the second extension line segment, and is farther away from the $n^{th}$ trace line than the second extension line segment.

7. The display device of claim 1, wherein, in the first sensing region, the first trace line to the $n^{th}$ trace line of the first group line respectively overlap corresponding ones of the first to the $n^{th}$ electrodes of the first group electrode, and do not overlap any of the first to $m^{th}$ electrodes of the second group electrode.

8. The display device of claim 7, wherein a number of the corresponding ones of the first to the $n^{th}$ electrodes of the first group electrode decreases from the first trace line to the $n^{th}$ trace line of the first group line.

9. The display device of claim 7, wherein respective lengths of the first trace line to the $n^{th}$ trace line decrease from the first trace line toward the $n^{th}$ trace line of the first group line.

10. The display device of claim 1, wherein the second group electrode and the first group line extend in substantially a same direction in the first sensing region.

11. A display device comprising an input sensor, the input sensor comprising:
    a first input sensor that overlaps a first sensing region, and that comprises:
        an insulation layer;
        a first group electrode extending in a first direction, and comprising a first electrode to an nth electrode that are arranged in a second direction crossing the first direction;
        a second group electrode crossing the first group electrode, and comprising a first electrode to an mth electrode;
        a first group line comprising a first trace line to an nth trace line that are respectively electrically connected to the first electrode to the nth electrode of the first group electrode; and
        a second group line comprising a first trace line to an mth trace line that are respectively electrically connected to the first electrode to the mth electrode of the second group electrode; and
    a second input sensor that overlaps a second sensing region that is different from the first sensing region,
    wherein n and m are natural numbers equal to or greater than 2, n being greater than m and not being an integer multiple of the m,
    wherein the first trace line to the $n^{th}$ trace line of the first group line overlap the first sensing region,
    wherein the first trace line to an $i^{th}$ trace line among the first to $n^{th}$ trace lines of the first group line are uniformly located to correspond to the first electrode to an $(m-1)^{th}$ electrode of the second group electrode, i being a natural number equal to or greater than 2,
    wherein an $(i+1)^{th}$ trace line to the $n^{th}$ trace line among the first to $n^{th}$ trace lines of the first group line are located to correspond to the $m^{th}$ electrode of the second group electrode,
    wherein a number of the (i+1)th to the nth trace lines is greater than a number of trace lines of the first group line that correspond to the (m−1)th electrode of the second group electrode,
    wherein each of the first electrode to the $m^{th}$ electrode of the second group electrode comprises division electrodes extending substantially in the second direction and being spaced apart from each other in the first direction in the first sensing region, and
    wherein the first group line corresponding to the first electrode to the $m^{th}$ electrode of the second group electrode is between the division electrodes in the first sensing region.

12. The display device of claim 11, wherein the division electrodes have a unitary shape in the first sensing region, and are on the insulation layer.

13. The display device of claim 11, wherein each of the first electrode to an $i^{th}$ electrode of the first group electrode comprises:
    sensing patterns on the insulation layer, and arranged in the first direction; and
    bridge patterns below the insulation layer, and respectively connecting neighboring ones of the sensing patterns through contact holes that penetrate the insulation layer.

14. The display device of claim 11, wherein the first group line and the second group line are below the insulation layer in the first sensing region, and
    wherein the first input sensor further comprises a dummy electrode at a same layer of the first group line and the second group line, the dummy electrode overlapping the first group electrode and the second group electrode.

15. The display device of claim 14, further comprising a display panel comprising emission regions and a non-emission region between the emission regions below the first input sensor and the second input sensor, and
    wherein the first group line, the second group line, and the dummy electrode overlap the non-emission region.

16. The display device of claim 15, wherein each of the division electrodes defines openings that correspond to the emission regions.

17. The display device of claim 16, wherein the emission regions comprise a first color emission region, a second color emission region, and a third color emission region collectively defining a unit emission region that comprises:
    a first unit emission region at which the first color emission region and the second color emission region are on one side of the third color emission region, and at which the third color emission region is on a downside position in the second direction with respect to the first color emission region and the second color emission region; and
    a second unit emission region at which the first color emission region and the second color emission region are on one side of the third color emission region, and at which the third color emission region is on an upside position in the second direction with respect to the first color emission region and the second color emission region, wherein the first unit emission region and the second unit emission region are alternately located along the first direction, and are alternately located along the second direction, and wherein the openings comprise a first opening that corresponds to the first color emission region, a second opening that corresponds to the second color emission region, and a third opening that corresponds in common to the third color emission region of the first unit emission region and the third color emission region of the second unit emission region, the third color emission region of the first unit emission region and the third color emission region of the second unit emission region being adjacent to each other in the second direction.

18. The display device of claim 15, wherein each of the division electrodes comprises:

a first line segment that extends in the first direction; and
a second line segment that extends in the second direction,
wherein the dummy electrode comprises:
  a first line segment that extends in the first direction, and that overlaps the first line segment of a corresponding one of the division electrodes; and
  a second line segment that extends in the second direction, and that overlaps the second line segment of the corresponding division electrode, and
wherein a width of the first line segment of the dummy electrode is less than a width of the first line segment of the corresponding division electrode.

19. The display device of claim 1, wherein the insulation layer overlaps the first sensing region and the second sensing region, wherein the second input sensor has a configuration substantially similar to a configuration of the first input sensor, and
wherein an arrangement of the first group line in the second input sensor is laterally symmetric to an arrangement of the first group line in the first input sensor.

20. A display device comprising an input sensor that comprises:

a sensing region;
a non-sensing region adjacent to the sensing region,
a first group electrode extending in a first direction in the sensing region, and comprising a first electrode to an $n^{th}$ electrode that are arranged in a second direction crossing the first direction;
a second group electrode crossing the first group electrode, and comprising a first electrode to an $m^{th}$ electrode in the sensing region;
a first group line comprising a first trace line to an $n^{th}$ trace line that are respectively electrically connected to the first electrode to the $n^{th}$ electrode of the first group electrode; and
a second group line comprising a first trace line to an $m^{th}$ trace line that are respectively electrically connected to the first electrode to the $m^{th}$ electrode of the second group electrode,
wherein the first trace line to the $n^{th}$ trace line of the first group line overlap the sensing region,
wherein the first trace line to the $m^{th}$ trace line of the second group line overlap the non-sensing region,
wherein the sensing region comprises sensing units arranged in an n×m arrangement,
wherein a crossing area where one of the first to $n^{th}$ electrodes of the first group electrode crosses one of the first to $m^{th}$ electrodes of the second group electrode is placed in a corresponding unit of the sensing units,
wherein k lines of the first group line overlap corresponding sensing units in a first region of the sensing region, k being a natural number equal to or greater than 1,
wherein p lines of the first group line overlap corresponding sensing units in a second region of the sensing region, p being a natural number greater than k, such that a spacing between adjacent ones of p lines is different than a spacing between adjacent ones of the k lines.

* * * * *